United States Patent
Waller, Jr.

(10) Patent No.: US 9,641,133 B2
(45) Date of Patent: *May 2, 2017

(54) ADAPTIVE RAIL POWER AMPLIFIER TECHNOLOGY

(71) Applicant: James K. Waller, Jr., Clarkston, MI (US)

(72) Inventor: James K. Waller, Jr., Clarkston, MI (US)

(*) Notice: Subject to any disclaimer, the term of this patent is extended or adjusted under 35 U.S.C. 154(b) by 0 days.

This patent is subject to a terminal disclaimer.

(21) Appl. No.: 15/218,463

(22) Filed: Jul. 25, 2016

(65) Prior Publication Data

US 2016/0336902 A1    Nov. 17, 2016

Related U.S. Application Data

(63) Continuation of application No. 13/859,889, filed on Apr. 10, 2013, now Pat. No. 9,402,128.

(60) Provisional application No. 61/622,696, filed on Apr. 11, 2012.

(51) Int. Cl.
| | |
|---|---|
| *H03F 1/02* | (2006.01) |
| *H04R 3/00* | (2006.01) |
| *H03F 3/183* | (2006.01) |
| *H03F 3/217* | (2006.01) |

(52) U.S. Cl.
CPC ......... *H03F 1/0238* (2013.01); *H03F 1/0233* (2013.01); *H03F 3/183* (2013.01); *H03F 3/217* (2013.01); *H04R 3/00* (2013.01); *H03F 2200/375* (2013.01)

(58) Field of Classification Search
CPC ...... H03F 1/0238; H03F 1/0233; H03F 3/217; H03F 3/183; H03F 2200/375; H04R 3/00
USPC ...... 381/120, 28; 330/127, 136, 163, 207 A, 330/251, 297
See application file for complete search history.

(56) References Cited

U.S. PATENT DOCUMENTS

| | | | |
|---|---|---|---|
| 4,445,095 A | 4/1984 | Carver | |
| 6,104,248 A | 8/2000 | Carver | |
| 6,636,103 B2 | 10/2003 | Wurcer et al. | |
| 7,733,178 B1* | 6/2010 | Delano | H03F 1/0244 330/207 A |
| 8,008,975 B1 | 8/2011 | Allen et al. | |

(Continued)

FOREIGN PATENT DOCUMENTS

| | | |
|---|---|---|
| EP | 2 056 451 A2 | 5/2009 |
| EP | 2 322 108 A1 | 5/2011 |

*Primary Examiner* — David Ton
(74) *Attorney, Agent, or Firm* — Frank J. Catalano; Gable Gotwals

(57) ABSTRACT

Adaptive rail power amplifier technology processes an audio signal by feeding the audio signal to the power amplifier to produce an output signal, applying positive and negative power supply voltages centered with respect to the audio signal to the positive and negative power supply rails of the power amplifier, comparing the output signal with the positive and negative power supply rail voltages to produce dynamically varying positive and negative control signals, feeding the positive and negative control signals to positive and negative high current charge pumps and adding supplemental positive and negative voltages from the positive and negative charge pumps to the positive and negative power supply rails to produce a linear adaptive rail voltage which tracks the output signal.

1 Claim, 18 Drawing Sheets

(56) References Cited

U.S. PATENT DOCUMENTS

| | | | | |
|---|---|---|---|---|
| 8,072,266 | B1* | 12/2011 | Hoomes | ............... H03F 1/025 330/207 A |
| 8,093,953 | B2* | 1/2012 | Pierdomenico | ....... H03F 1/0222 330/297 |
| 2009/0115531 | A1 | 5/2009 | Jones et al. | |
| 2011/0068872 | A1 | 3/2011 | Iwamatsu | |

* cited by examiner

PRIOR ART

ADAPTIVE RAIL POWER AMPLIFIER TECHNOLOGY

CROSS-REFERENCE TO RELATED APPLICATIONS

This is a continuation application which claims priority to co-pending U.S. Utility patent application Ser. No. 13/859,889 filed Apr. 10, 2013 and to U.S. Provisional Patent Application No. 61/622,696, filed on Apr. 11, 2012, the contents of which are hereby incorporated by reference in their entirety.

BACKGROUND OF THE INVENTION

Numerous designs have been developed and used over the past years incorporating various methods of providing a modulated power supply for an audio amplifier in order to improve efficiency and reduce dissipation of the power devices. Many prior art designs have disclosed either dual or multiple rails that switch to a higher voltage when the output swing of the amplifier is near clipping. These designs have been termed Class H and Class G where a secondary or multiple rail voltages are selected as required based on amplifier output swing. More complex designs have been realized with continuously variable rails that track the input signal and adjust the power supply rails so as to maintain a constant voltage between the output devices output swing and the power supply rail voltage. Most of these amplifiers are very complex requiring Pulse Width Modulation of the power supply and increased manufacturing requirements due to the large associated circuitry required to provide the tracking supply rails. Countless Class D designs have also been offered commercially which convert an input audio signal into a series of output pulses. When the pulses are averaged over time and low pass filtered to remove higher order harmonic information the output will be a replica of the input signal. While Class D offers the highest level of efficiency it is also one of the most difficult to use in applications where low EMI/RFI performance is required. While all of the various topologies have seen varying degrees of success commercially, the designs that offer the best cost vs. performance gain the widest market acceptance. Many of the numerous designs have excellent performance but may also be the most difficult to manufacture. At the same time high output automotive audio power amplifiers based on switch mode power supply technology has been available for years as aftermarket products but have not been embraced by the original equipment manufacturers (OEM) due to a number of undesirable side effects including switching transients which cause large levels of RFI emissions. In order to deliver high power automotive audio systems an efficient, high power DC to DC converter is required, which will convert the 12 volt automotive battery voltage to a higher supply voltage with high current output capability. The automotive charging system typically produces between 13.5 and 14.4 volts when the engine is running. While this is a slight increase above the 12 volt battery voltage this is not enough for high power amplification of audio signals. Amplifiers capable of high output power either need more voltage swing than the typical 14.4 volts available with the engine running or need to provide an extremely high current output in order to drive very low impedance loads. Typically, speakers with lower impedances have lower efficiencies and therefore a gain in output power with audio amplifiers that can deliver higher output current may not result in a large net gain in sound pressure levels. The formula to calculate output power is given by:

$$POWER = V_{rms} \cdot I_{rms} = \frac{V_{rms}^2}{R} = \frac{V_{peak}^2}{2R}$$

An ideal power amplifier that can swing all the way to the power supply rails with a 14.4 volt supply can deliver a peak amplitude of 7.2 volts when connected to a 4 ohm load and would deliver 6.48 watts. Most automotive audio power amplifiers are dual amplifiers connected in what is termed "Bridge Mode" with one amplifier channel swinging positive and one swinging negative with the load connected between the two amplifier outputs and can, as a result, deliver twice the voltage swing across the load. This means that an ideal amplifier that can swing to the rails in bridge mode can deliver 14.4 volts peak which would deliver a total of 25.9 watts into a 4 ohm load. In reality, most power amplifiers are far from ideal and can typically only swing to within about 1.5 volts of the positive and negative power supply rails. As a result, the real world power amplifiers actual power output with the alternator running and 14.4 volts at the battery is closer to 16 watts. Thus it becomes obvious that the output of a car audio amplifier is limited by the voltage of the car battery with the alternator running. In most actual car systems, the amplifiers are connected in bridge mode configuration as described above, and speaker impedances are no higher than 4Ω, but it becomes apparent that the maximum output power per channel is roughly 30 watts even when driving a 2 ohm load and only about 16 watts with a 4 ohm load. High-power car amplifiers have been available for many years in the automotive aftermarket and these amplifiers use a DC-to-DC converter to generate a higher power supply voltage. In order to increase the battery voltage to a level capable of producing a higher power level most aftermarket automotive power amplifiers use switch mode power supplies SMPS to convert or transfer power from the 12 volt automotive battery (14.4 volts with the engine running) to a higher output voltage. While switching power supplies have seen improvements in terms of output power and efficiency even the best designs today produce an unacceptable level of radio frequency interference RFI and as a result have not seen wide acceptance for use in OEM vehicles. Other improvements in SMPS have been made offering higher switching frequencies, which allow component sizes to be reduced but produce even higher levels of RFI emissions. The common (SMPS) used in automotive aftermarket audio applications switches the battery voltage at a frequency between 25 kHz and 100 kHz to generate an AC square wave signal at the primary side of a step-up transformer. The stepped up waveform on the secondary of the transformer is rectified and filtered back to a DC signal. The output is typically a symmetrical +/−25 to 35 volts.

DC-DC converters based on charge pump or flying capacitor technology have been widely used in low power DC-DC converters but have seen limited use in high power applications due to a number of limitations including high pulse currents that occur at the switching transients which reduce efficiency and increase RFI problems. The low power circuits typically switch at higher frequencies between 20 KHz and 150 KHz which reduce the size of the capacitors but also contribute to an increase the RFI emissions. Integrated circuits have been produced for years based on the concepts of charge pump circuitry and have provided circuits which offer low current designs capable of delivering only milliamps of current to an external load. U.S. Pat. No. 5,066,871 is an example of one such design but many of the integrated circuit manufacturers offer IC's based on charge pump technology. There are many current offerings for low power switched capacitor technology in integrated circuit form from manufacturers including Analog Devices, Linear Technologies and National Semiconductor, to name just a few. However, none of these circuits can be used in a higher power application that can deliver amperes of output power required for automotive audio power amplification.

One recent prior art system offers improved switched capacitor technology by charging a capacitor to the supply voltage and switching the charged capacitor when additional output swing is required. In order to keep the amplifier output swing centered, a reference voltage is added to the input to switch the amplifier center bias when the additional capacitor voltage is switched on. One drawback to this system is the adding of undesirable switching transients in the output signal. While this system will double the power supply voltage when needed, it is also limited to two times the power supply voltage, i.e. 28 volts with a 14 volt supply, and therefore requires relatively low impedance drivers in order to gain large amounts of output power. This system operates as a class H or class G amplifier when the additional rail voltage is switched on and off, which improves dissipated output device heat but does not gain the full advantage of a tracking rail or adaptive rail design. A full tracking rail or adaptive rail design will provide even better reduction of dissipation. The implementation of a pulsed rail configuration will greatly reduce the heat dissipation of the power MOSFETs used in switching the supply voltage.

In another recent prior art system, a power amplifier is centered between the supply voltage and both the positive and negative rails are increased as the output of the amplifier requires more voltage swing. This system basically uses additional power amplifiers with a gain of 1 to track the audio power amplifier output at unity gain. The system monitors the audio amplifiers input or output swing and when a threshold is exceeded the power boost amplifiers will boost the power supply rails by driving charged capacitors between the output of the boost amplifiers and the power supply rails. This system does provide a tracking rail design which tracks the output swing of the audio power amplifier. However, the net gain in output power is relatively small, on the order of a few watts, compared to bridge mode designs. This is so because it is a single ended design. The second major drawback to this design is the complexity of the system, including the power boost amplifiers. In order to provide boost amplifiers with unity gain, a full amplifier circuit is implemented with a power MOSFET output stage. A relatively small gain in total system output power is achieved at the expense of increased cost and complexity in implementing this system. While the power boost amplifiers certainly can be fully integrated in IC form, reducing build complexity, the design requires large output MOSFETs and will therefore require expensive integrated circuit packaging that will provide some form of heat sink interface to keep the output devices cool. The prior art system also teaches using a gain slightly above unity in order to avoid capacitor voltage droop or sag due to the capacitor discharging under amplifier load. The amount of voltage droop or sag is difficult to measure in operation and, therefore, adding additional gain may be inadequate in some circumstances or may be excessive in others.

It is, therefore, an object of the invention to provide an adaptive rail power amplifier using charge pump circuitry which overcomes the limitations of the above-mentioned prior art designs allowing use in OEM automotive vehicles. It is another object to provide an adaptive rail power amplifier with the ability to produce an output voltage swing above the input power supply voltage dynamically and as needed. In particular, it is an object of the invention to provide a power amplifier with adaptive tracking power supply rails offering greatly reduced complexity. It is a further object of the invention to provide an adaptive rail power amplifier with dynamically controlled charge pump converters for use in automotive power amplifiers capable of delivering well in excess of 100 watts of output power. It is a further object of the invention to provide an increase of up to 3 times the input supply voltage as required, to increase the amplifier output swing. It is a yet a further object of the invention to provide an adaptive rail power amplifier technology capable of high power output level for use in OEM automotive applications without causing problems in radio reception. It is still another objective of the invention to provide an adaptive rail power amplifier technology with higher efficiency and reduced heat dissipation. It is yet another objective of the invention to offer improved tracking of the power supply rails that can automatically adapt to any droop or sag voltage in the stored charge of the capacitor used to elevate the power supply rails.

It is also an object of the invention to provide an alternate embodiment of the adaptive rail power amplifier which has the same level of performance as the above described invention with reduced parts and complexity. It is a further object of the invention to provide an alternate embodiment with a simplified design which lends itself to full integration. It is another object of the alternate embodiment of the invention to require a single reference voltage for proper operation and signal tracking.

SUMMARY OF THE INVENTION

With the forgoing and other objects in view there is provided, in accordance with the invention, an adaptive rail power amplifier technology that compares the output signal of the power amplifier with positive and negative adaptive power supply rails generating a pulsed control signal fed to high current charge pump circuits for providing an output voltage that is capable of exceeding the input supply voltage when the output signal swings beyond the limits of the input voltage.

The adaptive rail high current charge pump circuit includes a charge storage in device, also called a flying capacitor, with one of its plates connected to two high current switches. One high current switch is connected to the supply through a ferrite bead. The other high current switch is connected to ground through another ferrite bead. The other plate of the flying capacitor is connected to two high current diodes. The first high current diode is connected to the battery. The other high current diode is connected to the output node and to second charge storage capacitor to smooth the output voltage and deliver output current to the load. A dead zone circuit generates the proper timing to control the high current switches. The dead zone outputs are connected to the gate control of the high current switches. The charge pump circuit is controlled by the output of a comparator which compares the output signal of the power amplifier with the rail voltage, producing a dynamically varying pulsed output signal in response to the output swing of the amplifier and the adaptive rail output of the charge pump circuit.

In another embodiment of the invention, an adaptive rail control signal is derived by taking the difference between the amplifier output signal and the rail voltage. The derived difference signal is used to control a charge pump circuit in both saturated and linear mode, producing a linear adaptive rail voltage which tracks the output signal so as to provide an adaptively increasing power supply rail voltage.

In accordance with an added feature of the invention, multiple sections or blocks of the charge pump circuitry are combined to provide even higher output voltages, thereby increasing further the output voltage swing of the amplifier and allowing the use of higher efficiency higher impedance speaker loads.

While the invention will be described for use in automotive sound systems it is understood that many other applications for the invention are possible including any application where limited power supply voltage is seen.

BRIEF DESCRIPTION OF THE DRAWINGS

Other objects and advantages of the invention will become apparent upon reading the following detailed description and upon reference to the drawings in which.

While the invention will be described in connection with preferred embodiments thereof, it will be understood that it is not intended to limit the invention to those embodiments or to the details of the construction or arrangement of parts illustrated in the accompanying drawings.

DETAILED DESCRIPTION

In the following description of the Figures, similar reference symbols designate corresponding structural parts or functional blocks.

The Prior Art Automotive Aftermarket Power Amplifier

Figure 1:
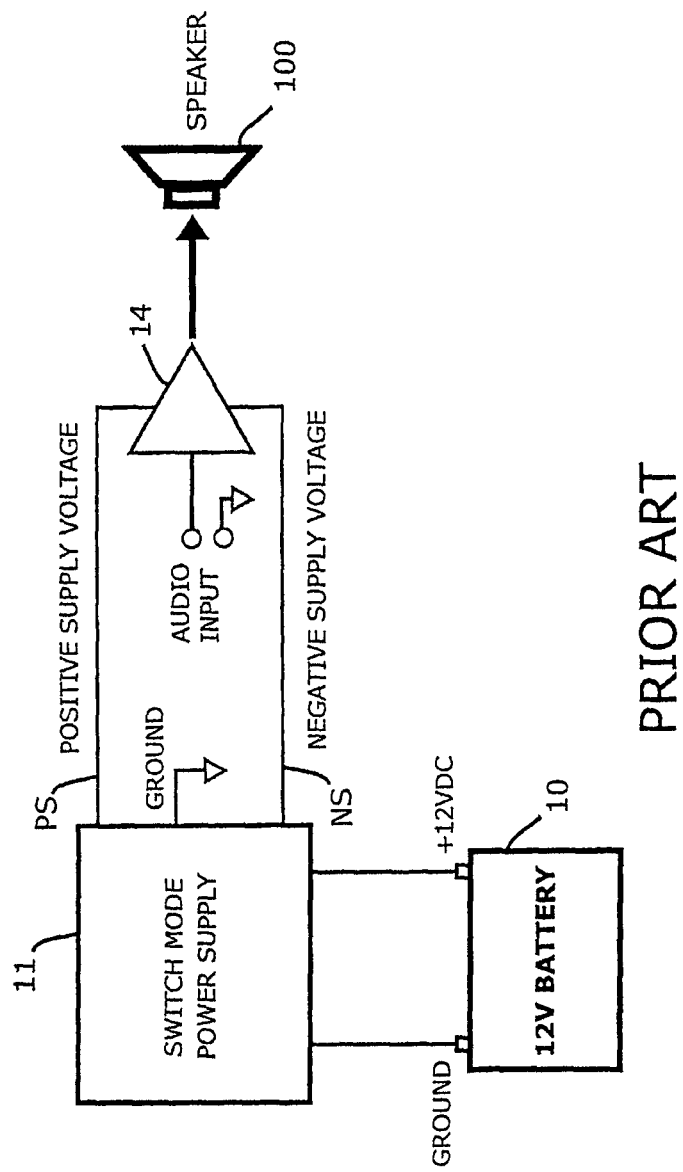
FIG. 1 is a block diagram of a typical prior art car audio system.

Turning first to FIG. 1, a block diagram of the typical aftermarket automotive power amplifier is shown. The switch mode power supply 11 and the audio power amplifier 14 are contained in one chassis or unit. A 12 volt battery 10 provides the input power to the switch mode power supply 11 via a +12 volt and ground connection. The switch mode power supply 11 converts the 12 volt battery voltage to a bipolar output voltage referenced to ground, providing a positive output voltage PS and a negative output voltage NS, which supplies bipolar power to the amplifier 14. The audio amplifier 14 receives an audio input signal and amplifies this audio input signal to drive a speaker 100.

Figure 2:
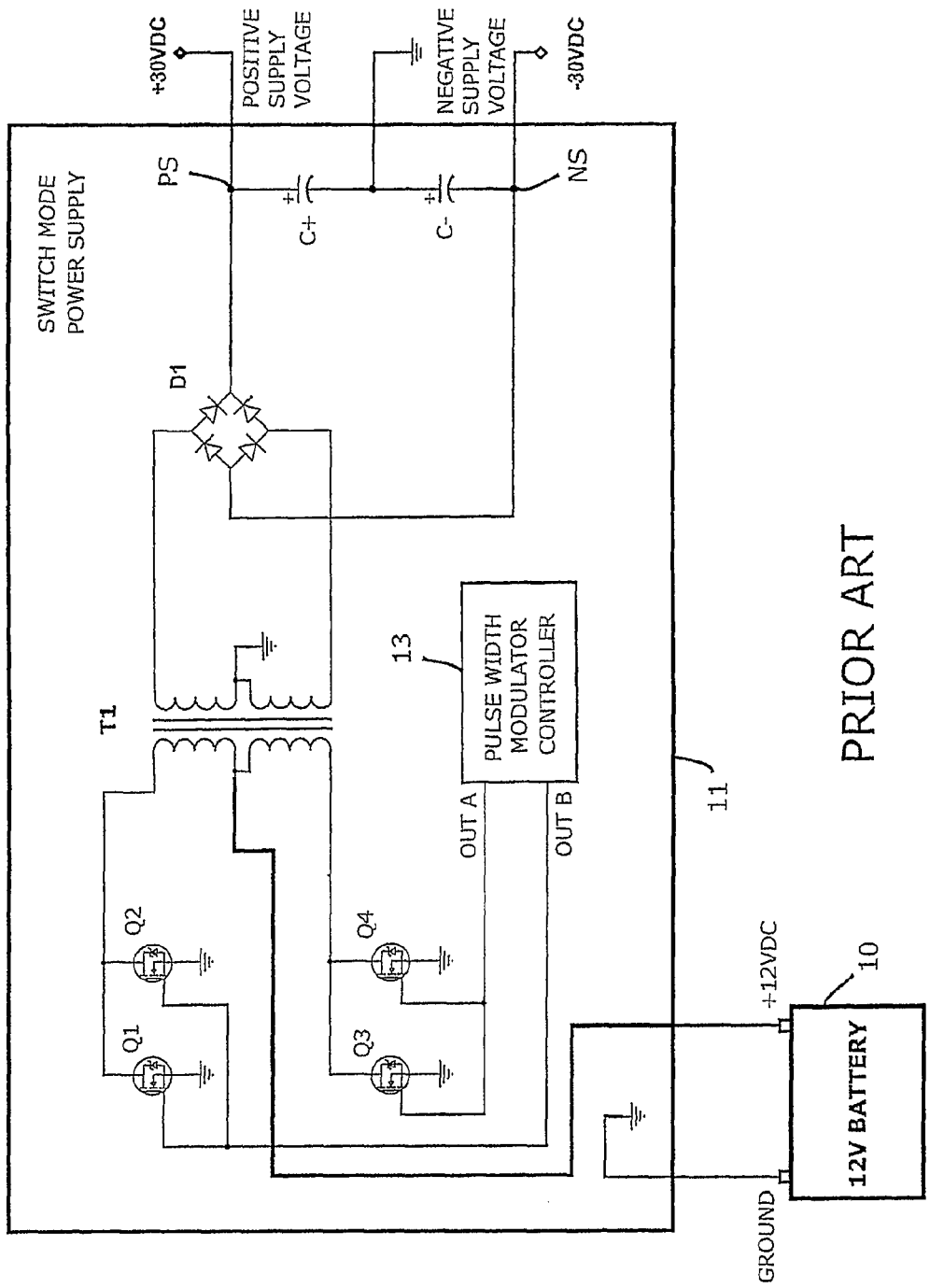
FIG. 2 is a simplified schematic of the typical switch mode power supply used in prior art aftermarket audio systems.

Looking at FIG. 2, a simplified schematic of the switch mode power supply 11 of FIG. 1 is shown. The switch mode power supply 11 receives its input power from the 12 volt battery 10, which is connected to the center tap of a transformer T1. A pulse width modulator controller 13 controls the switching of high power MOSFET switching transistors Q1, Q2, Q3 and Q4. The switching topology is called a "push-pull" converter because the transformer T1 has a "center-tapped" primary. The center tap is permanently connected to the 12 volt car battery, typically via an LC filter (not shown), to reduce switching spikes in the battery voltage. The ends of the primary side of the transformer T1 are each connected to a different paralleled pair of MOSFETs that switch them to ground in each conduction cycle. MOSFETs Q1 and Q2 are parallel connected to one primary end and MOSFETs Q3 and Q4 are parallel connected to the other primary end so as to provide higher switching current than would be possible with a single MOSFET transistor. The secondary side of the switch mode power supply transformer T1 has its center tap connected to ground and the two outputs of the transformer T1 are connected to switching diodes in a diode bridge D1. The diodes of the bridge D1 must be extremely fast diodes and are typically discrete diodes in a TO220 package with a 10 amp minimum rating and at a suitable voltage rating based on the output voltage of the transformer. The output of the diode bridge D1 is filtered by capacitors C+ and C− at nodes PS and NS, respectively, to provide a positive and negative 30 volt high current output capable of providing the required voltage and current to power an audio amplifier. The typical switching frequency of this type of switch mode power supply is between 25 KHz and 100 KHz, which reduces the size of both the transformer T1 and the output filter capacitors C+ and C. Due to the high switching frequency and the large current pulses generated when switching a high current square wave at high frequencies, this design suffers from high EMI/RFI emissions. When the audio power amplifier 14 is delivering large amounts of current to the speaker load, the RFI emissions can actually reduce FM radio reception and, in some cases, cause complete loss of certain AM radio band frequencies. As a result, the automotive OEMs have avoided using this type of switch mode power supply/power amplifier technology.

Pulsed Adaptive Rail Power Amplifier for Automotive Use

Figure 3:
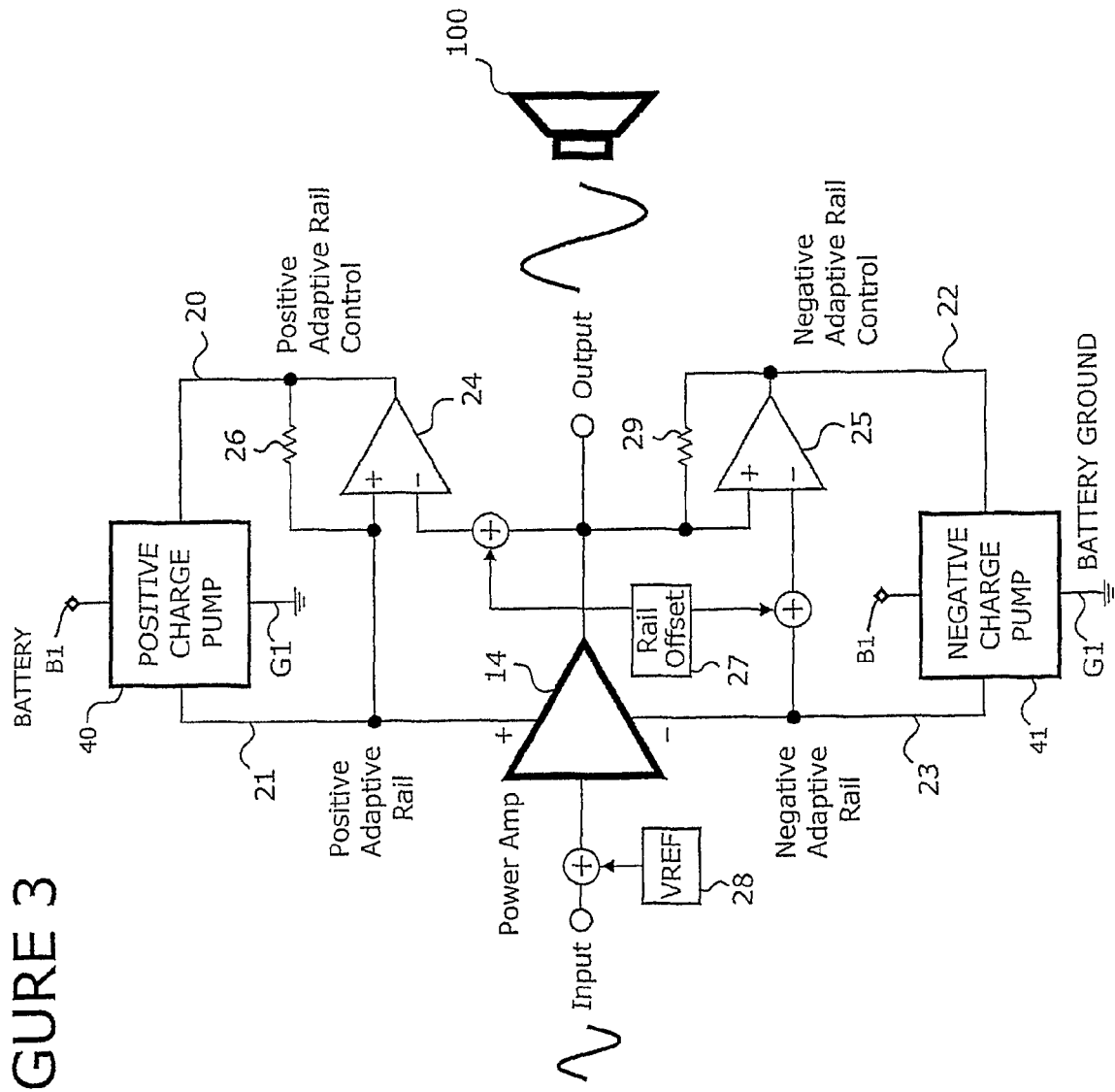
FIG. 3 is a block diagram of a pulsed mode adaptive rail power amplifier embodiment of the invention for use in automotive applications.

Turning now to FIG. 3, a block diagram of a pulsed adaptive rail power amplifier according to the invention is shown. The power amplifier 14 receives both positive and negative power from charge pump circuits 40 and 41, respectively. The input of the power amplifier 14 is biased at VREF 28, which is ½ the auto battery voltage. The battery voltage will be between 12 volts without the engine running and 14.4 volts with the alternator charging the battery. This means that VREF 28 will track at ½ the battery voltage, keeping the output voltage swing of the amplifier 14 centered between the positive battery voltage and ground. A comparator 24 compares the output voltage swing of the power amplifier 14 and the positive adaptive rail voltage 21 at the output of the positive charge pump circuit 40. A resistor 26 provides hysteresis for the comparator 24 which determines in part the switching frequency of the adaptive pulsed rail 21 and provides a window of switching between transitions. By increasing the hysteresis, a larger transition time between switching points occurs, which reduces the switching transitions of the positive cycling waveform. When the output voltage swing of the power amplifier 14 approaches the battery voltage, the output of the comparator 24 changes from a high output to low. Due to the positive feedback of the hysteresis resistor 26, the output of the positive charge pump circuit 40 will increase only a small voltage based on the amount of hysteresis. This small voltage increase will cause the comparator 24 to change state again to high. This slight positive/negative cycle will continue as long as the output signal swing of the amplifier 14 requires more voltage than the input battery voltage at B1. This will provide a series of output pulses at the comparator 24 which change in pulse width and frequency based on the current demand on the output of the positive charge pump circuit 40. As the amplifier 14 starts to swing negative with respect to the input battery voltage, the positive adaptive rail 21 will reach a quiescent point and the amplifier 14 will now draw its power from the battery voltage available at B1. The voltage difference between the output of the amplifier 14 and the adaptive rail voltage 21 is further defined by the rail offset voltage 27 applied to the negative input of the positive rail comparator 24. This offset is adjusted to a level required to provide sufficient voltage for the output stage of the amplifier 14 to drive the load, as shown the speaker 100, but also keeps the voltage across the output devices of the power amplifier 14 low so as to keep dissipated heat to a minimum. The output voltage of the positive adaptive rail 21 of the positive charge pump circuit 40 will track the output voltage swing of the amplifier 14 within the predefined offset voltage set by the rail offset 27 regardless of any drop in stored charge in the capacitors C1P and C2P of the positive charge pump circuit 40 (seen in FIG. 4) due to the fact that the system operates within a feedback loop. The system compares the output signal of the power amplifier 14 plus the offset voltage 27 with the positive rail voltage 21 and switches the positive charge pump circuit 40 as required to keep the positive rail voltage 21 within the specified offset regardless of any loss in the stored charge of the capacitors C1P and C2P in the charge pump circuit 40 (see FIG. 4). As mentioned above, when the output voltage swing of the amplifier 14 drops below the battery voltage by an amount equal to the offset voltage 27, the positive rail voltage 21 returns back to the voltage of the battery. Thus, the positive charge pump circuit 40 allows an increase above the battery voltage up to two times the battery voltage as required to track the output voltage swing of the amplifier 14.

When the output voltage swing of the amplifier 14 approaches ground, the output of the negative rail comparator 25 changes from high to low. Due to the positive feedback of its hysteresis resistor 29, the output of the negative charge pump circuit 41 will decrease only a small voltage, based again on the amount of hysteresis. This small voltage decrease will cause the negative rail comparator 25 to change states again to high. This slight positive/negative cycle will continue, as long as the output signal swing of the power amplifier 14 requires more voltage than the ground side of the battery. This will provide a series of output pulses at the negative rail comparator 25 changing in pulse width and frequency based on the current demand on the output of the negative charge pump circuit 41. As the power amplifier 14 starts to swing positive with respect to the battery ground, the negative adaptive rail 23 will reach a quiescent point and the power amplifier 14 will now draw its power from the battery ground. The voltage difference between the output of the power amplifier 14 and the negative adaptive rail 23 is also further defined by the rail offset 27 applied to the negative input of the negative rail comparator 25. The system compares the output signal of the power amplifier 14 with the negative rail voltage 23 plus the offset voltage 27 and switches the negative charge pump circuit 41 as required to keep the negative rail voltage 23 within the specified offset regardless of any loss in the stored charge of the capacitors C1N and C2N in the negative charge pump circuit 41 (see FIG. 5).

Both charge pump circuits 40 and 41 receive the battery voltage applied at B1 and at G1 the battery ground. The charge pump circuits 40 and 41 are capable of providing large amounts of output current at the positive adaptive rail 21 and the negative adaptive rail 23. This allows the amplifier 14 to swing nearly three times the typical output voltage that would otherwise be available without the added voltage increase from charge pump circuits 40 and 41.

The Charge Pump Circuits

Figure 4:
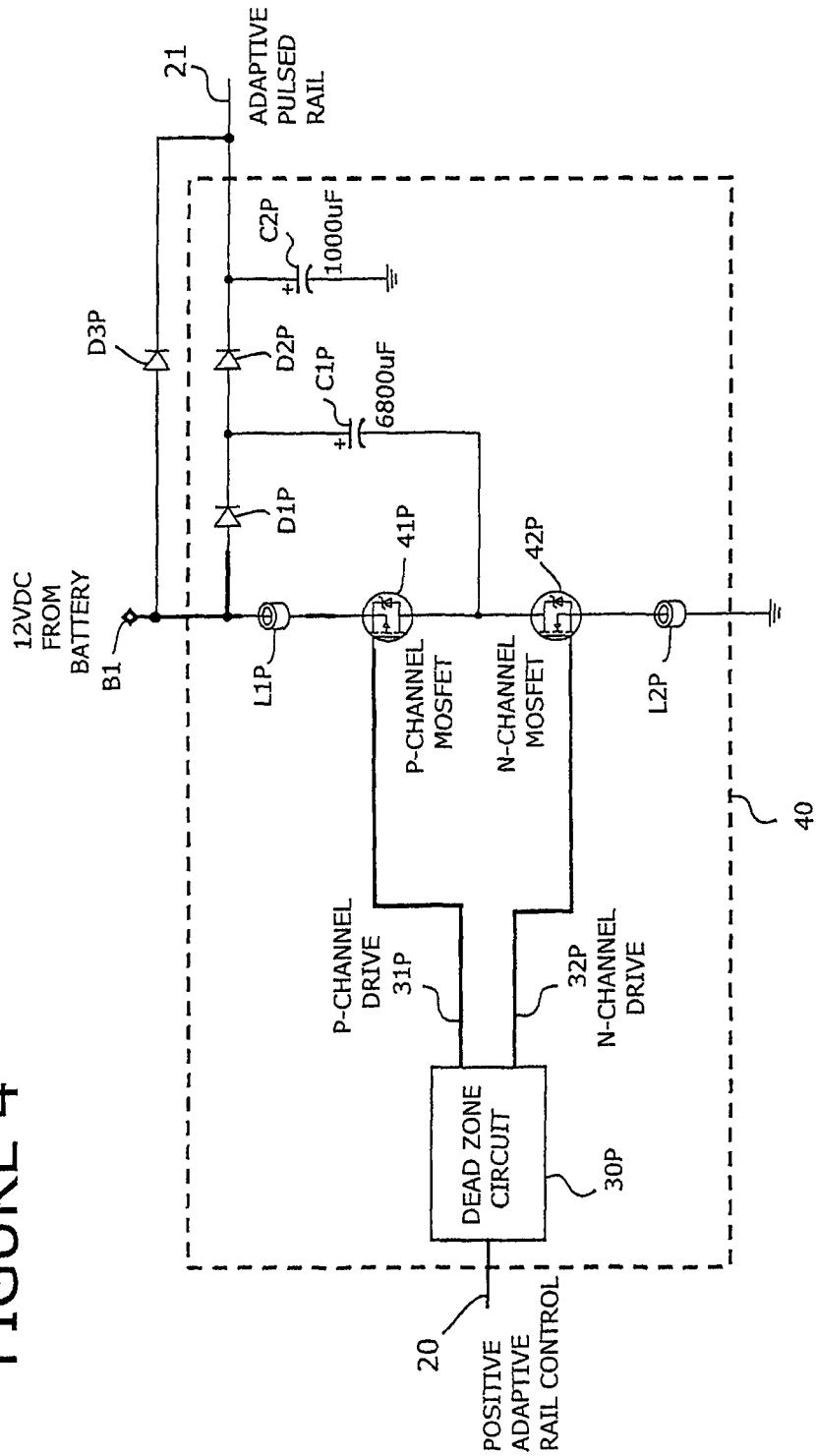
FIG. 4 is a partial block, partial schematic diagram of the positive charge pump circuit of FIG. 3.

Looking now at FIG. 4, a partial block, partial schematic diagram of the positive charge pump circuit 40 of FIG. 3 is shown. A positive dead zone circuit 30P receives the positive adaptive rail control signal 20 from its comparator 24. The dead zone circuit 30P provides an output signal with a minimum of 10 microseconds dead time between the negative going signal for the P-channel drive 31P and the negative going signal for the N-channel drive 32P. This avoids having the P-channel MOSFET 41P and the N-channel MOSFET 42P turned on at the same time, avoiding overheating of the switching devices or the device destruction which would occur if both MOSFETs 41P and 42P were on at the same time. The dead zone circuit 30P also provides a 10 microseconds dead time when the positive adaptive rail control signal 20 goes positive. This will ensure that the N-channel power MOSFET transistor 42P is completely off before switching on the P-channel power MOSFET transistor 41P. When the positive charge pump circuit 40 is powered on, the N-channel MOSFET transistor 42P will be turned on, connecting the negative plate of the first positive capacitor C1P to ground. This will charge the first positive rail capacitor C1P through its schottky diode D1P connected to the B1 terminal, which is connected to the 12 volt battery or other power source. The first positive rail capacitor C1P is the flying capacitor of the positive charge pump circuit 40, which transfers its charge through another schottky diode D2P into a second positive rail capacitor C2P, providing the output voltage 21 of the positive adaptive pulsed rail 21. Both diodes D1P and D2P are schottky diodes which provide low forward voltage drop and fast switching response. The battery voltage at B1 is also fed directly to the adaptive positive rail 21 through a third diode D3P. When the positive adaptive rail control signal 20 goes negative, the N-channel power MOSFET transistor 42P switches off and the P-channel power MOSFET transistor 41P switches on, connecting the negative plate of the flying capacitor C1P to the B1 terminal, allowing forward conduction of the schottky diode D2P and transferring voltage from the flying capacitor C1P to the positive pulsed rail 21. The source connection of the P-channel power MOSFET transistor 41P and the source connection of the N-channel power MOSFET transistor 42P connect to the B1 terminal and ground connection through ferrite beads L1P and L2P, respectively, which reduce the high speed switching transients reducing RFI emissions of the circuit. The second positive rail capacitor C2P is typically between 100 uF and 1000 uF for subwoofer applications which allows a fast release time for the positive adaptive rail 21. When the positive adaptive rail control signal 20 goes high, the P-channel MOSFET transistor 41P turns off and the N-channel MOSFET transistor 42P turns on again, charging the positive rail flying capacitor C1P.

Figure 5:
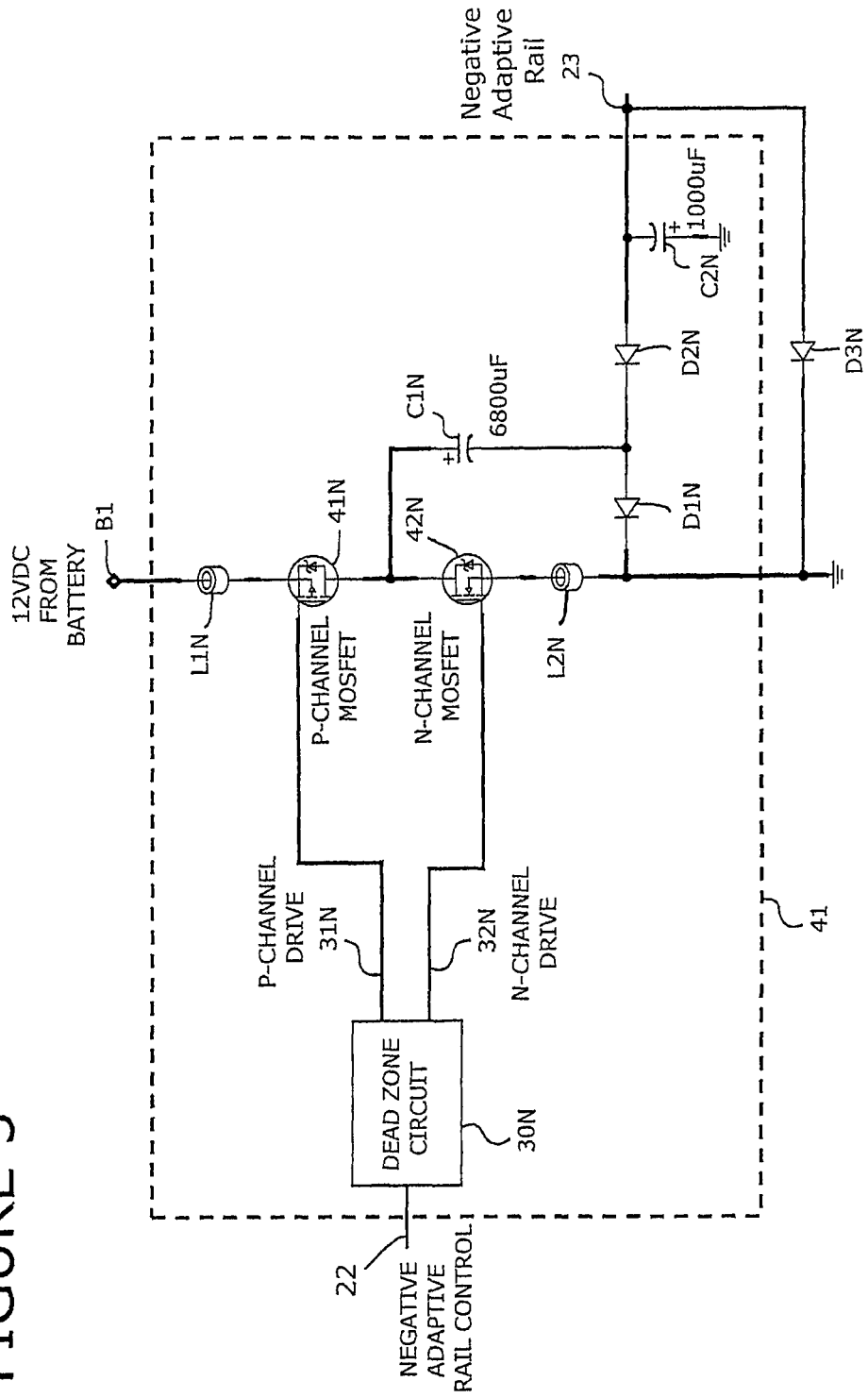
FIG. 5 is a partial block, partial schematic diagram of the negative charge pump circuit of FIG. 3.

FIG. 5 is a partial block, partial schematic diagram of the negative charge pump circuit 41 of FIG. 3. Its dead zone circuit 30N receives the negative adaptive rail control signal 22 from its comparator 25. The negative dead zone circuit 30N provides an output signal with a minimum of 10 microseconds dead time between the negative going signal for the P-channel drive 31N and the negative going signal for the N-channel drive 32N. This avoids having the P-channel MOSFET 41N and the N-channel MOSFET 42N turned on at the same time, avoiding overheating of the switching devices and the device destruction which would occur if both negative charge pump MOSFETs 41N and 42N were on at the same time. The negative dead zone circuit 30N also provides a 10 microseconds dead time when the negative adaptive rail control signal 22 goes negative. This will ensure that the N-channel power MOSFET transistor 42N is completely off before switching on the P-channel power MOSFET transistor 41N. When the negative charge pump circuit 41 is powered on, the P-channel MOSFET transistor 41N will be turned on, connecting the positive plate of its flying capacitor C1N to the terminal B1. This will cause the negative rail flying capacitor C1N to charge in cooperation with a first negative rail schottky diode MN connected to the ground terminal G1, which is connected to the 12 volt battery ground or other power source. The flying capacitor C1N of the negative charge pump circuit 41 transfers its charge through another schottky diode D2N into a second capacitor C2N, providing the output voltage 23 of the negative adaptive pulsed rail 23. Both diodes MN and D2N are schottky diodes which provide low forward voltage drop and fast switching response. The battery ground is also fed directly to the adaptive negative rail 23 through a third diode D3N. When the positive adaptive rail control signal 22 goes positive, the P-channel power MOSFET transistor 41N switches off and the N-channel power MOSFET transistor 42N switches on, connecting the positive plate of the negative rail flying capacitor C1N to the ground terminal and allowing forward conduction of its schottky diode D2N, transferring voltage from the flying capacitor C1N to the negative rail 23. The source connection of the P-channel power MOSFET transistor 41N and the source connection of the N-channel power MOSFET transistor 42P connect to the B1 terminal and ground connection through ferrite beads L1P and L2P and L1N and L2N, respectively, which reduce the high speed switching transients and reduce RFI emissions of the circuit. The second negative rail capacitor C2N is typically between 100 uF and 1000 uF for subwoofer applications which allows a fast release time for the negative adaptive rail 23. When the negative adaptive rail control signal 22 goes low, the P-channel MOSFET transistor 41P turns off and the N-channel MOSFET transistor 42N turns on, again charging the negative rail flying capacitor C1N.

Figure 6:
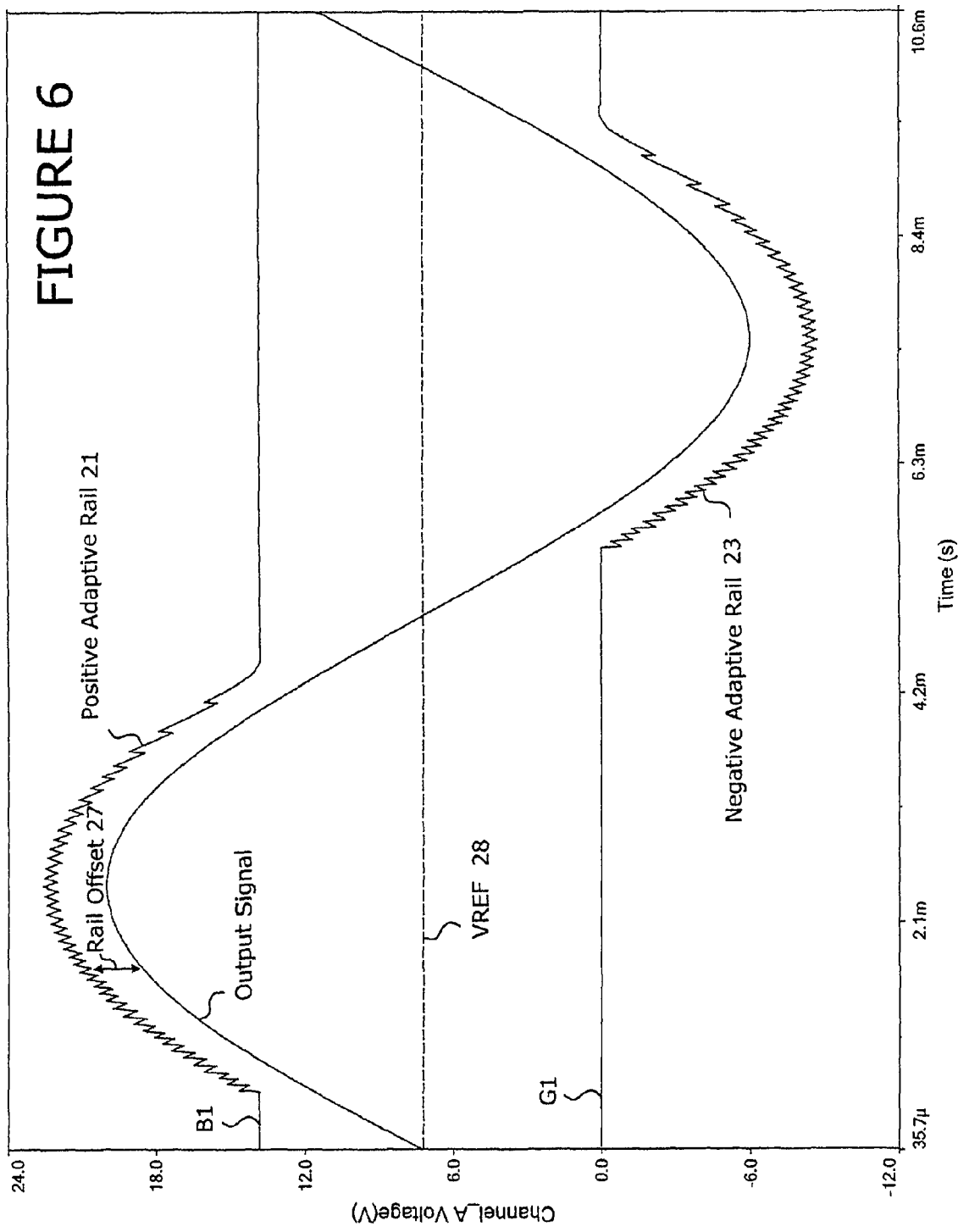
FIG. 6 is a graphic representation of the output voltage swing of the adaptive rail amplifier showing the positive and negative adaptive rail signals.

FIG. 6 is a graph of the output voltage swing of the adaptive rail amplifier showing the power amplifier output signal and the positive and negative adaptive rail signals 21 and 23. The amplifier output signal starts at VREF 28, which is shown in this graph at 7 volts and is based on a battery supply voltage of 14 volts. This will allow the amplifier output signal swing to be centered between the 14 volt battery voltage and battery ground at 0 volts DC. When the output signal swing goes positive by more than battery voltage minus the preset rail offset voltage 27, the positive supply rail increases with a series of positive going pulses, producing the positive adaptive rail 21. The positive adaptive rail 21 will track the output signal offset positive by the rail offset 27. When the output signal drops below the 14 volt battery voltage plus the pre-defined rail offset 27, the positive rail returns back to the battery voltage at 14 volts. As the output signal swings negative and approaches the negative rail at 0 volts DC by more than the predefined rail offset 27, the negative rail increases negative with a series of negative going pulses, producing the negative adaptive rail 21.

Figure 7:
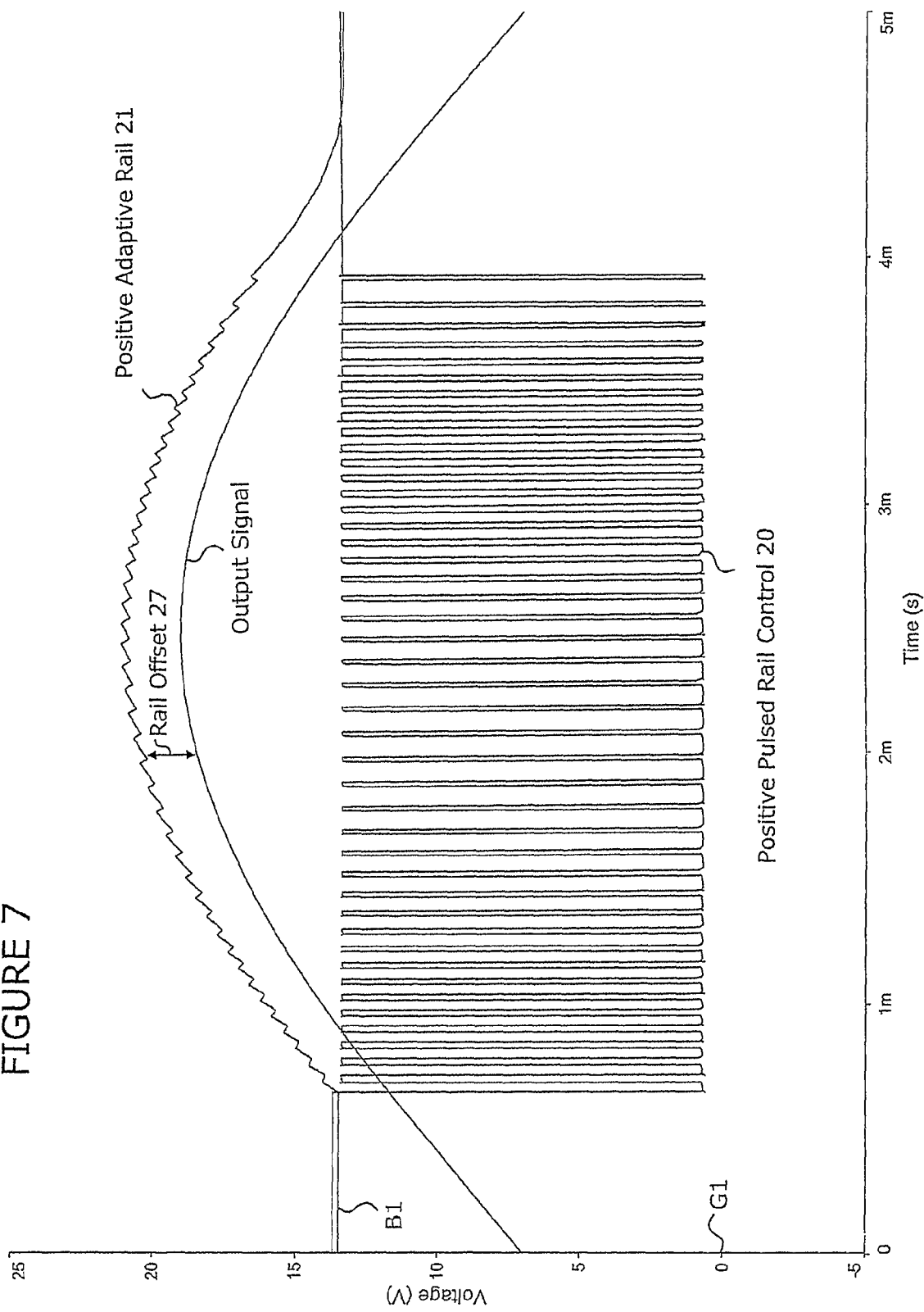
FIG. 7 is a graphic representation of the positive output signal swing of a 100 Hz sine wave showing the positive adaptive rail signal and positive pulsed rail control signal of FIG. 3.

FIG. 7 is a graph of the positive output signal swing of a 100 Hz sine wave showing the adaptive rail signal 21 and the positive pulsed rail control signal 20 of FIG. 3. FIG. 7 shows in greater detail only the positive going portion of the signal shown in FIG. 6 and further includes the positive pulsed rail control signal 20 in FIG. 3. As the output signal swings positive by an amount equal to the positive battery voltage 14 minus the predefined rail offset, the positive pulsed rail control starts to generate a series of pulses, which changes in pulse width depending on the amount of output current required to source the positive supply voltage to the power amplifier 14 in FIG. 3. The negative going pulses get wider as the output signal swings more positive and the demand for output current increases. When the signal starts to swing negative from the maximum peak swing, the output pulses change in both frequency and width until the output signal swings negative by more than the predefined rail offset 27 with respect to the 14 volt battery voltage. The positive pulsed rail control signal 20 stops changing and provides a positive signal allowing the flying capacitor C1P in the positive charge pump circuit 40 of FIG. 4 to fully charge. The negative going signal will produce a similar but negative response from the negative adaptive rail control signal 22 and the negative charge pump circuit 41 shown in FIG. 3.

Typical Power Amplifier

Figure 8:
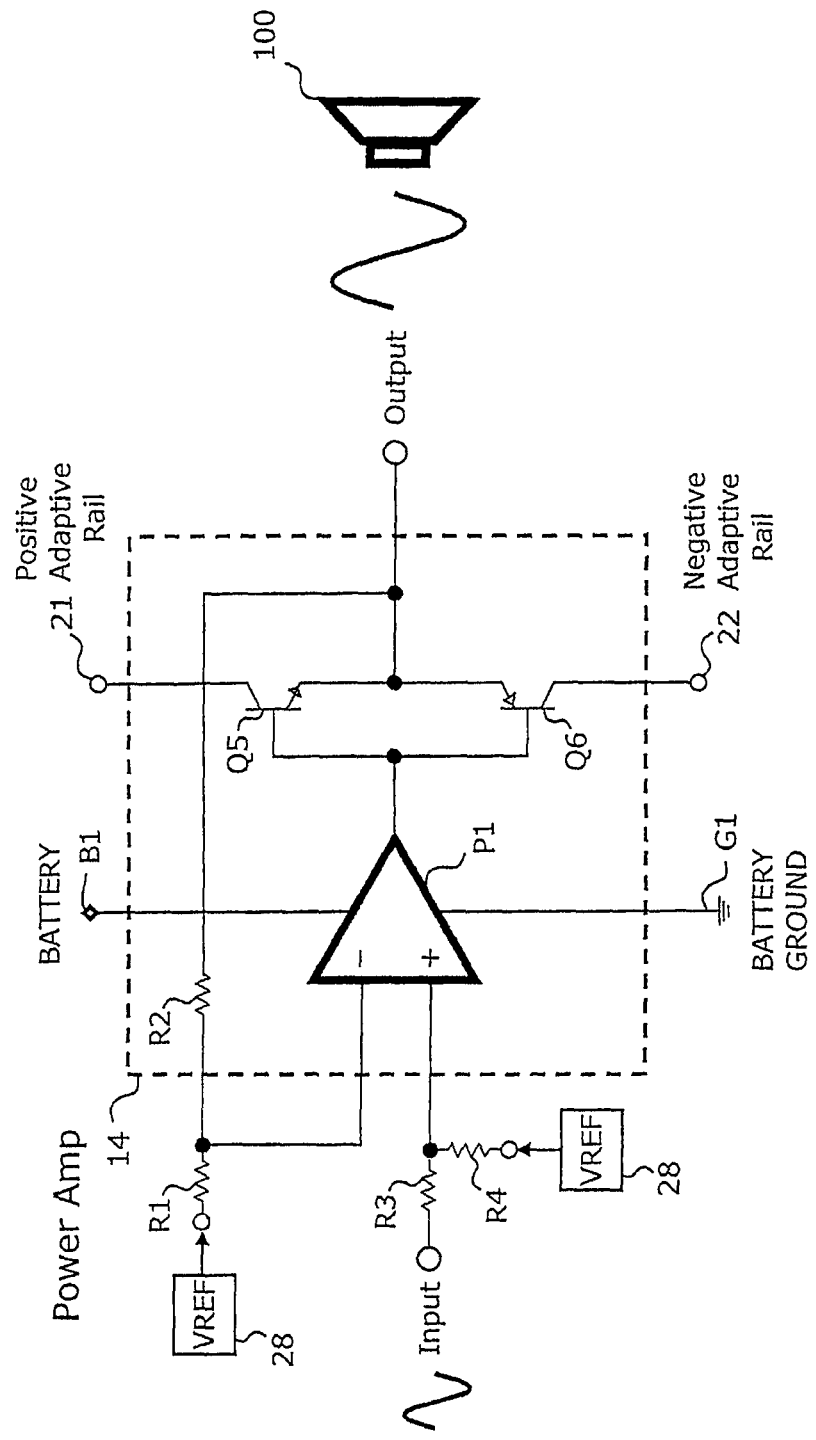
FIG. 8 is a simplified schematic diagram of a typical power amplifier block 14 of FIG. 3.

Turning now to FIG. 8, a simplified schematic diagram of a typical power amplifier 14 of FIG. 3 is shown. The power amplifier 14 includes a preamplifier/pre-drive circuit P1 and a bipolar output stage including transistors Q5 and Q6. The preamplifier P1 receives a positive input signal via one resistor R3 plus VREF 28 bias via another resistor R4. VREF 28 is also applied via a resistor R1 to the negative input of the preamp/pre-drive circuit P1. The preamp circuit P1 receives its power directly from the battery voltage applied at B1 and battery ground. The pre-drive output signal drives the base of both transistors Q5 and Q6 which receive the positive adaptive rail voltage 21 and the negative adaptive rail voltage 23, respectively. Amplifier negative feedback is provided via another resistor R2.

Many possible amplifier configurations will operate with the disclosed invention, including Class A/B, Class B, Class D and output stages utilizing bipolar or MOSFET transistors. As shown, the preamp/pre-drive circuit is connected directly to the battery voltage, but this stage of the power amplifier 14 can also be configured to connect to the adaptive rails 21 and 22. If a single amplifier 14 is used, as in FIG. 8, the output speaker 100 will need to be decoupled from the amplifier by use of a large value capacitor (not shown) so as to eliminate the VREF bias from the output signal applied to the speaker 100. The invention can also be implemented with dual amplifiers in bridge mode, effectively doubling the output voltage swing across the speaker load and eliminating the need for output decoupling capacitors.

While the above-disclosed embodiments of the invention provide excellent performance and improved manufacturing costs over the prior art, it may be desirable to eliminate all of the switching transients for use in certain automotive applications so as to eliminate virtually all of the RFI/EMI emissions of the amplification system. As can be seen with reference to FIG. 3, the system operates with a large gain in the feedback loop due to the comparators 24 and 25. The invention can also be implemented with reduced loop gain, allowing more linear operation of the adaptive rails and eliminating the high frequency switching transients of the pulsed rails. The main tradeoff of this embodiment is that the MOSTFETs that drive the positive adaptive rail and negative adaptive rail will see a slight increase in dissipated heat due to using them in a linear mode of operation.

Linear Mode Adaptive Rail Power Amplifier

Figure 9:
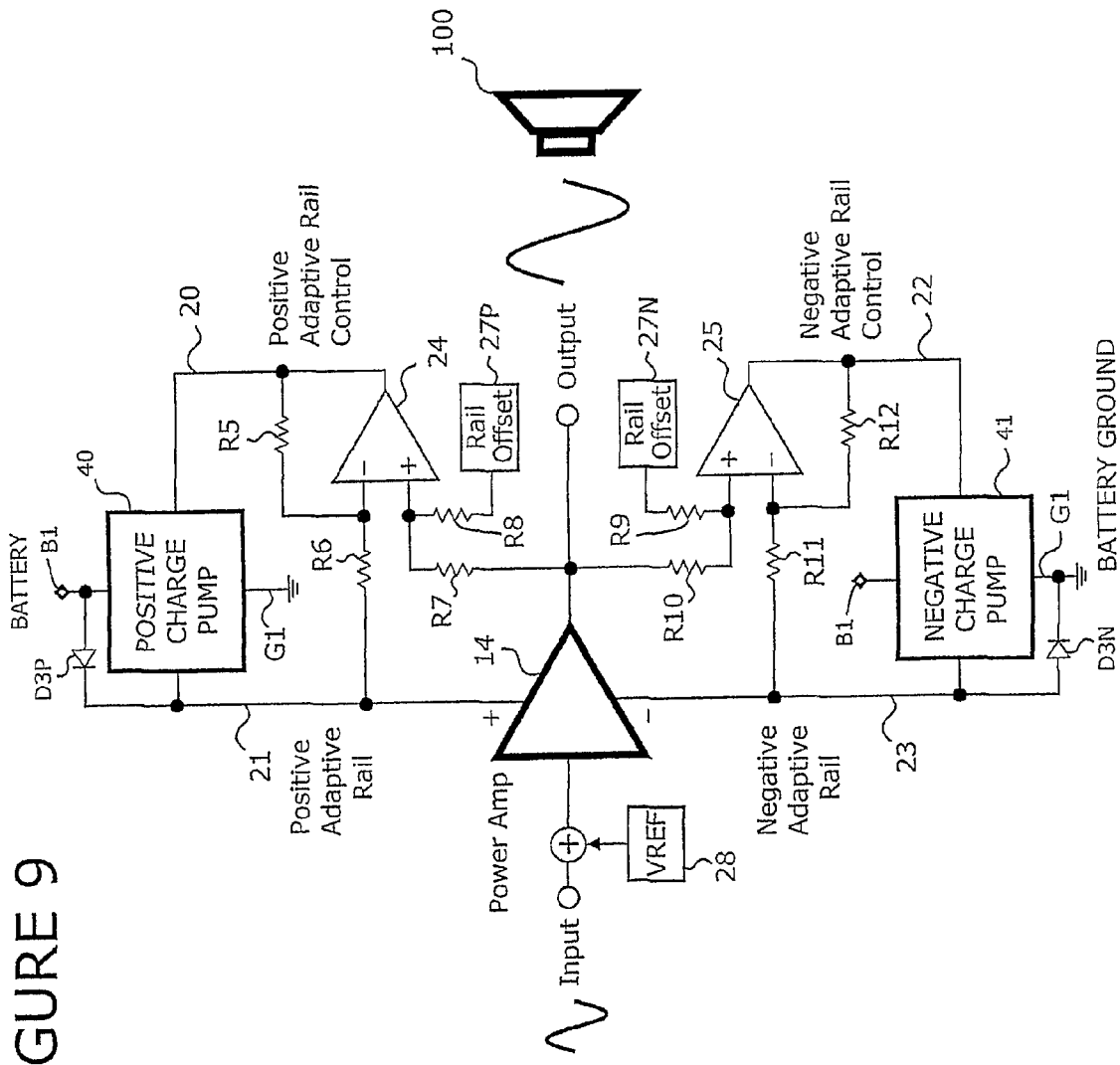
FIG. 9 is a block diagram of a linear mode embodiment of the invention providing non-pulsed adaptive rails with reduced EMI emissions.

In FIG. 9, a linear mode embodiment of the invention provides non-pulsed adaptive rails with reduced EMI emissions. The FIG. 9 circuit is the same basic circuit as shown in FIG. 3 with reduced feedback loop gain by changing the comparators 24 and 25 shown in FIG. 3 to differential amplifiers 24 and 25, as shown in FIG. 9. The power amplifier 14 receives both positive and negative power directly from the battery due to the schottky diodes D3P and D3N and also to the positive and negative charge pump circuits 40 and 41, respectively. The amplifier input is biased at VREF 28, which is ½ the auto battery voltage. As described above, the battery voltage will be between 12 volts without the engine running and 14.4 volts with the alternator charging the battery. This means that VREF 28 will track at ½ the battery voltage, keeping the output voltage swing of the amplifier 14 centered between the positive battery voltage and ground. A differential amplifier 24 provides an output signal which is the difference between the positive adaptive rail voltage 21 applied to the negative input via one resistor R6 and the amplifier output signal applied to the positive input by another resistor R7. A third resistor R5 provides negative feedback for the differential amplifier 24 and a fourth resistor R8 provides positive rail offset 27P applied to the positive input. The rail offset voltage 27P applied to the fourth resistor R8 is positive, typically 1.5 volts, and provides the proper offset required for the positive adaptive rail 21 to track the output signal. The gain of the differential amplifier 24 is selected to be less than one and typically on the order of 0.3 in order to avoid clipping the differential amplifier with a full scale output signal at the output of the amplifier 14. If the differential amplifier 24 clips prior to detecting the maximum output signal swing, the positive adaptive rail control signal 20 will not provide proper rail tracking. The differential output signal 20 is fed to the input of the positive charge pump circuit 40. The linear embodiment of the invention also operates in a feedback loop by taking the difference between the output amplifier's signal plus the offset voltage 27P and the positive rail voltage 21 and controls the output voltage of the positive charge pump circuit 40 as required to keep the rail voltage 21 within the specified offset regardless of any loss in the stored charge of the capacitors C1P and C2P in the charge pump circuit 40 (See FIG. 10).

Another differential amplifier 25 provides an output signal which is the difference between the negative adaptive rail 23 applied to the negative input via one resistor R11 and the amplifier output signal applied to the positive input via another resistor R10. A third resistor R12 provides negative feedback for the differential amplifier 25 and a fourth resistor R9 provides negative rail offset 27N applied to the positive input. The rail offset voltage 27N applied to the fourth resistor R9 is negative, typically −1.5 volts, and provides the proper offset required for the negative adaptive rail 23 to track the output signal. The gain of the differential amplifier 25 is selected to be less than one and typically on the order of 0.3 in order to avoid clipping the differential amplifier 25 with a full scale output signal at the output of the amplifier 14. If the differential amplifier 25 clips prior to detecting the maximum output signal swing, the negative adaptive rail control signal 22 will not provide proper rail tracking. The differential output signal 22 is fed to the input of the negative charge pump circuit 41.

Figure 10:
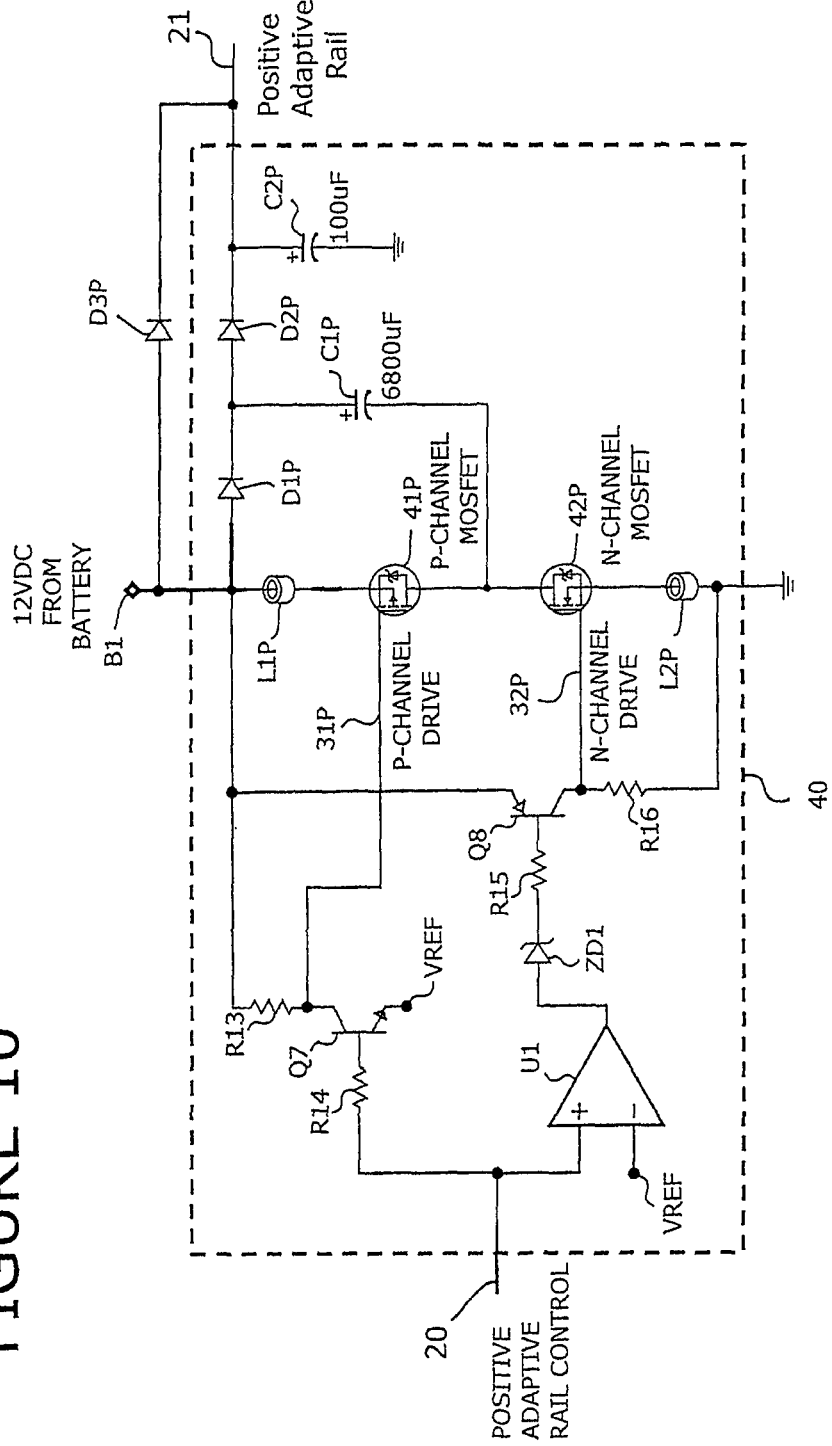
FIG. 10 is a schematic diagram of the positive charge pump circuit of FIG. 9.

FIG. 10 is a schematic diagram of the positive charge pump circuit 40 of FIG. 9. The positive charge pump circuit 40 receives the battery voltage at B1 and ground and battery voltage applied to B1 is fed to the positive adaptive rail 21 via a schottky diode D3P. The positive adaptive rail control 20 from the differential amplifier 24 of FIG. 9 is applied to a resistor R14 and to the positive input of a positive charge pump comparator U1. The positive charge pump comparator U1 is connected to ½ battery voltage VREF and the output will be low when the output signal from the power amplifier 14 of FIG. 9 is less than the battery voltage minus the rail offset 27P applied to the differential amplifier 24, also seen in FIG. 9. Continuing to look at FIG. 10, a first transistor Q8 operates as a switch to provide gate drive for the N-channel power MOSFET transistor 42P. The emitter of the transistor Q8 is connected to the battery voltage B1 and its collector is connected to ground through a resistor R16. The output of the positive charge pump comparator U1 is connected via a 6 volt zener diode ZD1 to the transistor base drive resistor R15. When the positive charge pump comparator U1 is low, the transistor Q8 is turned on, providing gate drive and turning on the N-channel power MOSFET transistor 42P, connecting the negative plate of the positive rail flying capacitor C1P to ground. A ferrite bead L2P is connected in series with the source connection of the N-channel MOSFET transistor 42P in order to reduce the switching transient from the N-channel power MOSFET transistor 42P. This allows the positive rail flying capacitor C1P to charge through the schottky diode D1P. When the positive adaptive rail control 20 goes positive by more than VREF, the positive charge pump comparator U1 will switch high, turning the transistor Q8 off and turning off the N-channel MOSFET 42P. When the positive adaptive rail 20 goes high by more than VREF plus the VBE of the transistor Q7, the transistor Q7 will start to conduct, providing gate drive to the P-channel power MOSFET transistor 41P. If the positive rail flying capacitor C1P is fully charged, the P-channel power MOSFET transistor 41P will operate in its linear region pulling the negative plate of its flying capacitor C1P positive. As the P-channel MOSFET transistor 41P starts to conduct, the gate drive signal supplied from the output of the differential amplifier 24 in FIG. 9 will be reduced and will thus provide a linear voltage increase that will track the output amplifier signal swing plus the rail offset voltage 27P. As the signal swing drops below the battery voltage plus the rail offset voltage, the P-channel power MOSFET transistor 41P will stop conducting. When the differential amplifier 24 output signal swings below VREF, the positive charge pump comparator U1 will switch low, turning on the N-channel power MOSFET transistor 42P, again providing charging for the positive rail flying capacitor C1P. The dead zone operation is provided due to the fact that the comparator U1 switches at VREF and the transistor Q7 starts to conduct only when the positive adaptive rail control signal 20 increases above VREF by one VBE. This ensures that both N-channel and P-channel power MOSFET transistors 41P and 42P cannot conduct at the same time.

Figure 11:
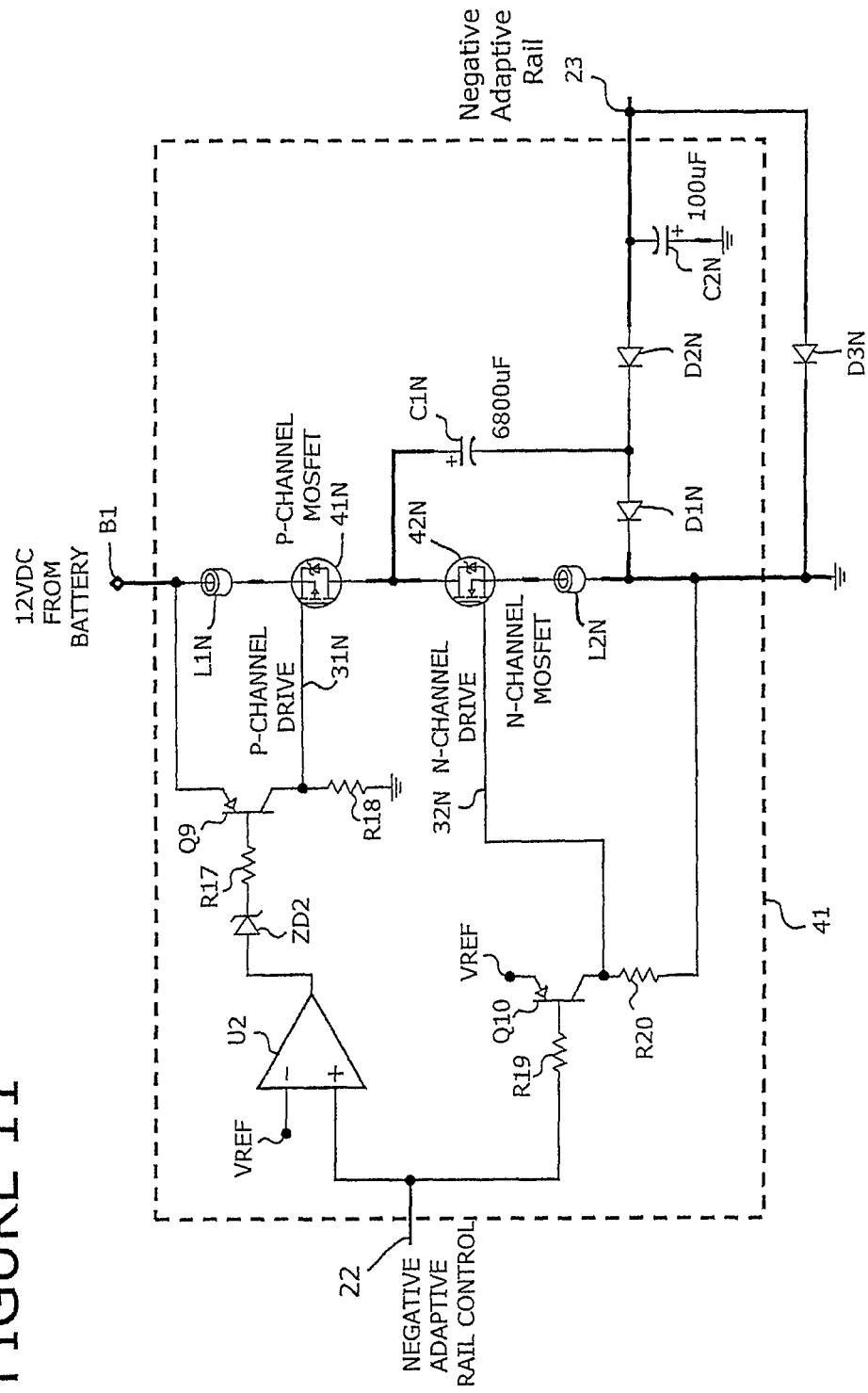
FIG. 11 is a schematic diagram of the negative charge pump circuit of FIG. 9.

In FIG. 11, the negative charge pump circuit 41 of FIG. 9 receives battery voltage at B1 and ground. Battery ground is fed to the negative adaptive rail 23 via the schottky diode D3N. The negative adaptive rail control 22 from the differential amplifier 25 of FIG. 9 is applied to R19 and to the positive input of a negative charge pump comparator U2. The negative charge pump comparator U2 negative input is connected to ½ battery voltage VREF and the output will be high when the output signal from the amplifier 14 of FIG. 9 is greater than the battery ground plus the rail offset 27N applied to the differential amplifier 25 also of FIG. 9. The output of the negative charge pump comparator U2 is connected to a 6 volt zener diode ZD2 and to the base drive resistor R17. Transistor Q9 operates as a switch and will switch off when the negative charge pump comparator U2 is high. The emitter of the transistor Q9 is connected to B1 battery voltage and its collector is connected to ground through a resistor R18. When Q9 is switched off, the P-Channel power MOSFET transistor 41N is turned on due to a resistor R18 pulling the P-Channel gate drive 31N low. When P-Channel power MOSFET transistor 41N is switched on, the positive plate of the negative rail flying capacitor C1N is tied to B1 providing ch, transistor Q9 is turned on eliminating gate drive 31N and turning off the p-channel power MOSFET transistor 41N. A ferrite bead L1N is connected in series with the source connection of the MOSFET transistor 41N in order to reduce the switching transient from the power MOSFET transistor 41N. When the negative adaptive rail 22 goes negative by more than VREF, the negative charge pump comparator U2 will switch low, turning the transistor Q9 on and turning off the P-channel MOSFET 41N. When the negative adaptive rail control 22 is low by more than VREF plus the VBE of the other transistor Q10, the transistor Q10 will start to conduct, providing gate drive to the N-channel power MOSFET transistor 42N. If the negative rail flying capacitor C1N is fully charged, the N-channel power MOSFET transistor 42N will operate in its linear region, pulling the positive plate of the negative rail flying capacitor C1N negative. As the MOSFET transistor 42N starts to conduct, the gate drive signal supplied from the output of the differential amplifier 25 in FIG. 9 will be reduced and will thus provide a linear negative voltage increase that will track the output amplifier signal swing plus the rail offset voltage 27N from FIG. 9. As the signal swing goes above battery ground plus the rail offset voltage, the N-channel power MOSFET transistor 42N will stop conducting. When the output signal of the differential amplifier 25 swings above VREF, the negative charge pump comparator U2 will switch high, turning on the P-channel power MOSFET transistor 41N again, providing charging for the negative rail flying capacitor C1N. Dead zone operation is provided due to the fact that the negative rail comparator U2 switches at VREF and the transistor Q9 starts to conduct only when negative adaptive rail signal 22 increases below VREF by one VBE. This ensures that both the N-channel power MOSFET and the P-channel power MOSFET transistors cannot conduct at the same time. Both positive and negative adaptive rails will track the amplifier output voltage swing plus the predefined positive and negative rail offset voltage up to the point that the signal swing in either direction exceeds the stored capacitor voltage available in the flying capacitors C1P and C1N in the positive and negative charge pump circuits 40 and 41. The linear embodiment shown in FIG. 9 provides an easy to manufacture design with reduced parts count and complexity.

Figure 12:
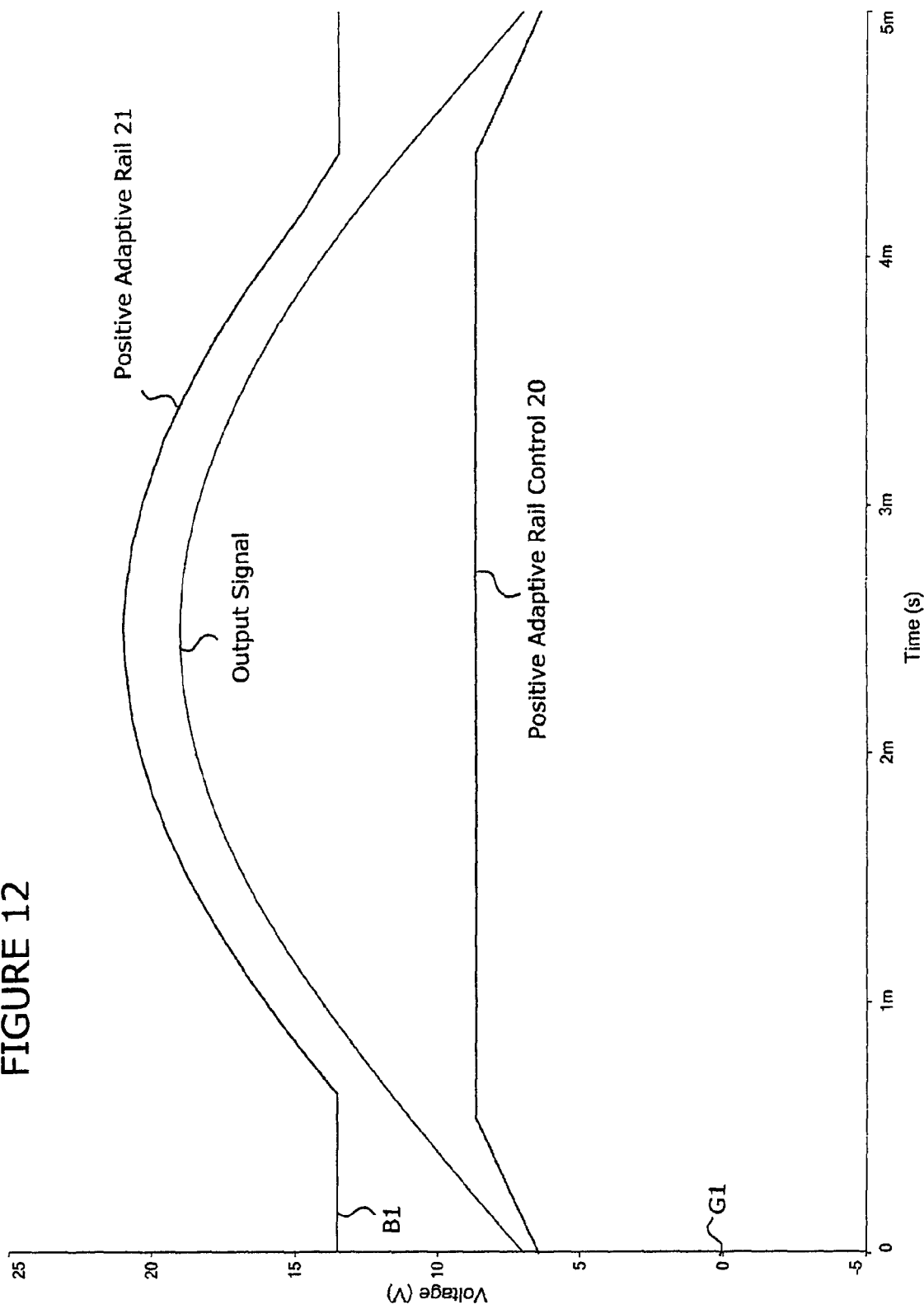
FIG. 12 is a graphic representation of the positive output signal swing of a 100 Hz sine wave showing the positive adaptive rail signal and positive adaptive rail control signal of FIG. 9.

FIG. 12 compares the positive output signal swing of a 100 Hz sine wave with the positive adaptive rail signal 21 and the positive adaptive rail control signal 20 of FIG. 9. FIG. 12 shows only the positive going portion of a signal from FIG. 9 and further includes the positive adaptive rail control 20 in FIG. 9. As the output signal swings positive by an amount equal to the positive battery voltage 14 minus the predefined rail offset, the positive adaptive rail control 20 starts to increase in voltage. The positive adaptive rail 21 linearly tracks the output signal plus a rail offset determined by the rail offset 27P in FIG. 9. When the signal starts to swing negative from the maximum peak swing, the output voltage continues to track the output signal until the output signal drops below the battery voltage, shown as 14 volts plus the rail offset voltage. The output of the difference amplifier 24 in FIG. 9, which produces positive adaptive rail control 20 shown in FIG. 12, will remain constant as the adaptive rail tracks the output signal so as to maintain a constant linear rail offset which tracks the output signal. The negative going signal will produce similar negative response from the negative adaptive rail control 22 and negative charge pump circuit 41 shown in FIG. 9.

Single Comparator Switched Charge Pump Tracking Rail

Figure 13:
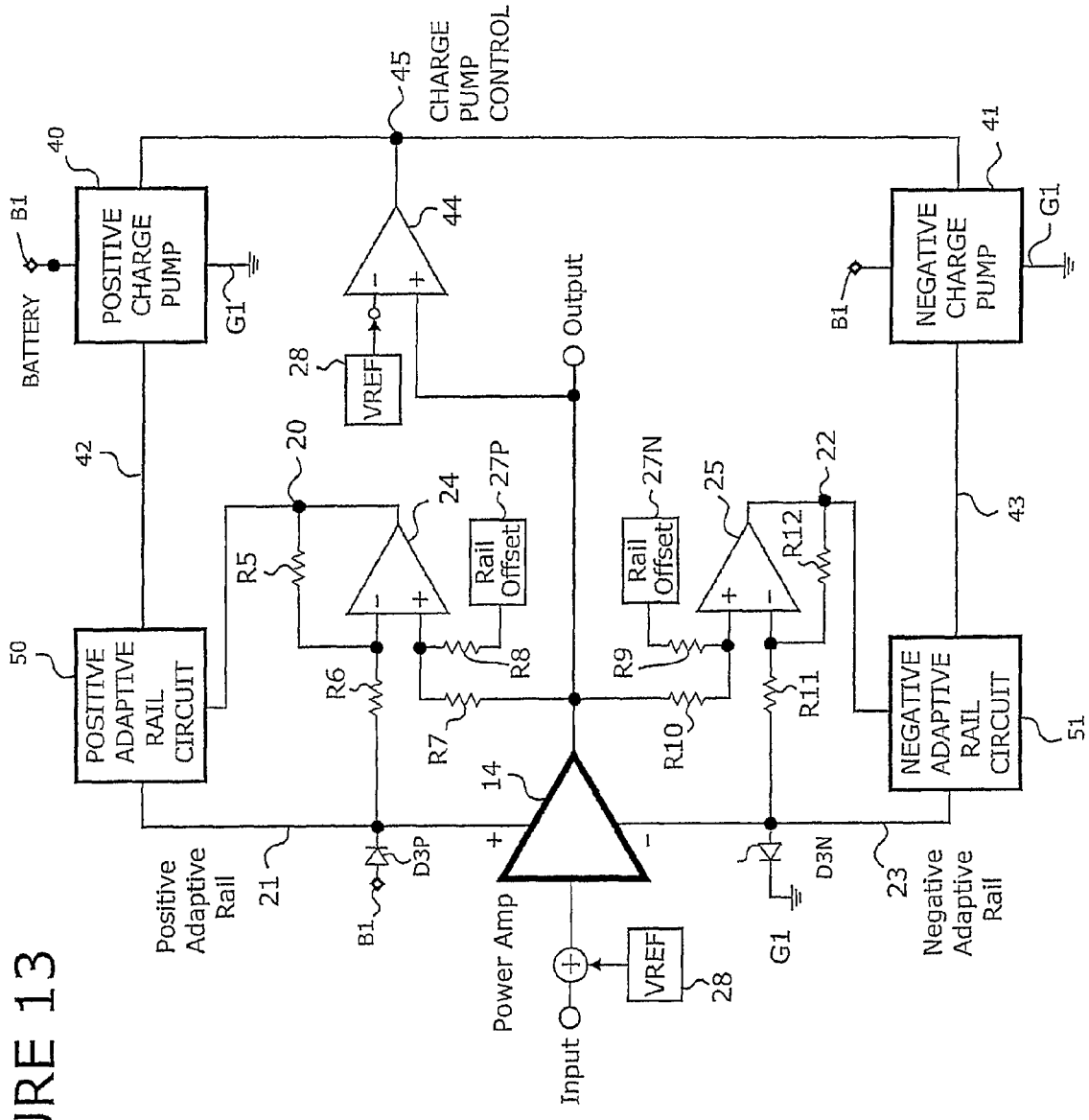
FIG. 13 is a block diagram of a single comparator charge pump tracking rail embodiment of the invention.

Referring now to FIG. 13, a single comparator switched charge pump tracking rail embodiment of the invention is shown. FIG. 13 uses the same reference designations as in FIG. 9 where similar circuit operation is disclosed. The power amplifier 14 output is connected to the positive input of the comparator 44 and the negative input of the comparator 44 is connected to VREF, which is ½ supply voltage. The comparator 44 provides a zero crossing detector and may include positive hysteresis so as to avoid comparator switching due to noise or very low level signals. When the output signal from the power amplifier 14 swings positive above VREF, the output 45 of the comparator 44 switches high and when the output signal of the power amplifier 14 swings negative below VREF, the output 45 of the comparator 44 switches low. The comparator 44 generates a control signal 45 to control the positive and negative charge pump circuits 40 and 41, which generates a positive 2× voltage at the output 42 of the positive charge pump circuit 40 and a negative 2× output voltage at the output 43 of the negative charge pump circuit 41. The charge pump circuits 40 and 41 are clocked by the audio signal even when the audio signal is low and does not require any additional output swing beyond the limits of the supplied battery voltage. Upon power up, the flying capacitors C1P and C1N in both charge pump circuits 40 and 41 are charged up to the battery voltage. With each positive swing of the output signal of the power amplifier 14, the internal flying capacitor C1P of the positive charge pump circuit 40 will transfer a charge to an internal output storage capacitor C1P within the positive charge pump circuit 40, thereby increasing the positive charge pump output voltage 42. With each negative swing of the output signal of the power amplifier 14, the internal flying capacitor C1N of the negative charge pump circuit 41 will transfer a charge to an internal output storage capacitor C2N within the negative charge pump circuit 41, thereby increasing the negative charge pump output voltage 43. The positive 2× voltage 42 is fed to the input of the positive adaptive rail circuit 50. The positive adaptive rail circuit 50 is controlled via the control signal 20 from the differential amplifier 24 and provides a positive adaptive rail output 21 which increases the positive power supply voltage above the battery voltage B1 which is connected to a schottky diode D3P. The nominal rail voltage 21 will be the same as the battery voltage B1 less the forward drop of the schottky diode D3P and will increase up to two times the battery voltage less any capacitor voltage sag that may occur in the positive charge pump circuit 40. The negative 2× voltage 43 is fed to the input of the negative adaptive rail circuit 51. The negative adaptive rail circuit 51 is controlled via the control signal 22 from the differential amplifier 25 and provides a negative adaptive rail output 23 which increases the negative power supply voltage below the battery ground connected to a schottky diode D3N. The nominal rail voltage 23 will be the same as battery ground less the forward drop of the schottky diode D3N and will increase negative up to two times the battery voltage less any capacitor voltage sag that may occur in the negative charge pump circuit 41. When the output voltage swing of the power amplifier 14 approaches the positive rail voltage 21 minus the rail offset 27P, the positive adaptive rail circuit 50 will become active and increase the positive rail 21 so as to keep the positive rail above the output voltage swing by an amount equal to the rail offset 27P. When the output voltage swing of the power amplifier 14 approaches the negative rail voltage 23 minus the rail offset 27N, the negative adaptive rail circuit 51 will become active and increase the negative rail voltage 23 so as to keep the negative rail below the amplifier 14 output voltage swing by an amount equal to the rail offset 27N.

Figure 14:
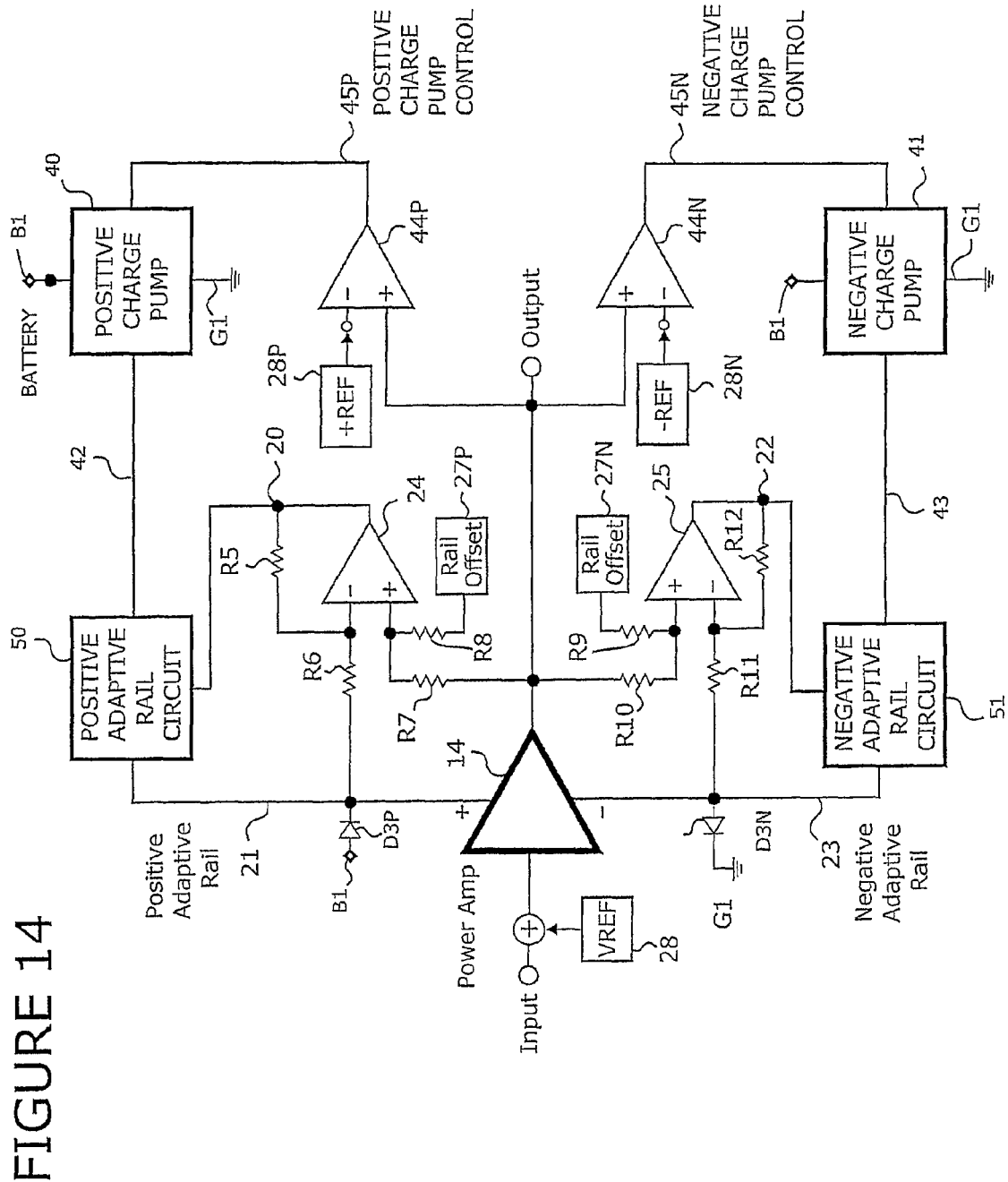
FIG. 14 is a block diagram of a switched dual comparator charge pump tracking rail embodiment of the invention.

Looking at FIG. 14, a modification to the embodiment of FIG. 13 can be made using two separate comparators 44P and 44N in place of the single comparator 44. That would allow the flying capacitors C1P and C1N of both the positive and the negative charge pump circuits 40 and 41 to charge on power up or idle (no audio signal present). One comparator 44P would compare the amplifier output signal swing with a positive reference voltage 28P to control the positive charge pump circuit 40 and the second comparator 44N would compare the amplifier output signal swing with a negative reference voltage 28N to control the negative charge pump circuit 41. This modification would allow the flying capacitors C1P and C1N in the positive and negative charge pump circuits 40 and 41 to both fully charge when the system is switched on or when no audio is present. Other modifications will become apparent to the skilled artisan.

Figure 15:
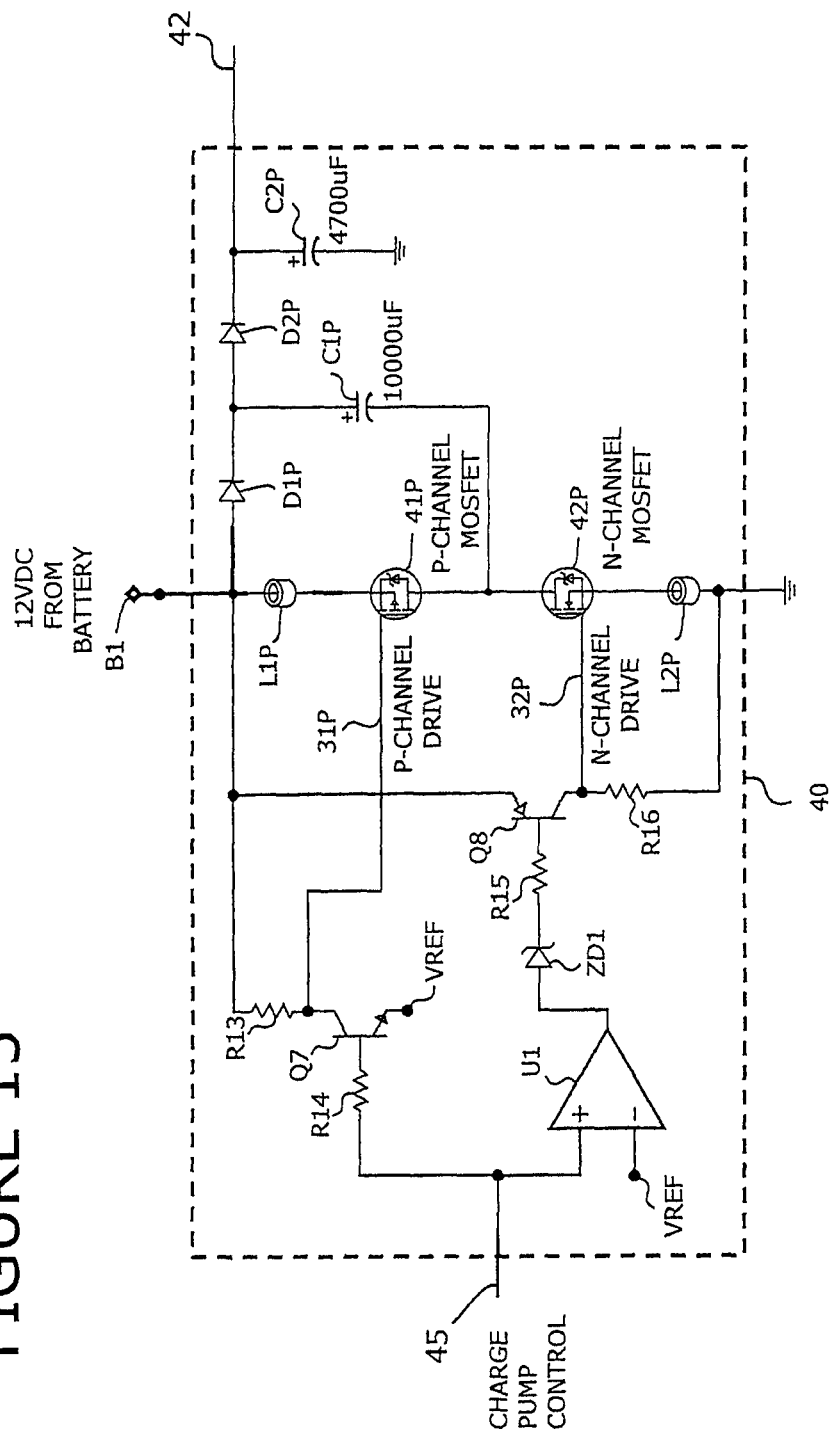
FIG. 15 is a schematic diagram of the positive charge pump circuit of FIG. 14.

Referring now to FIG. 15, the positive charge pump circuit 40 of the embodiment of FIG. 14 is the same circuit as shown in FIG. 10 without the shottky diode D3P and with changes in value for the capacitors C1P and C2P to optimize performance for this embodiment. As a result, the detailed description of FIG. 15 is the same as the description given for FIG. 10. After a few switching cycles of the comparator 44P of FIG. 14, the second positive charge pump capacitor C2P will charge up to a voltage equal to two times the battery voltage minus the forward diode drop of the schottky diodes D1P and D2P. There is no discharge path for the stored charge in the capacitor C2P until the positive adaptive rail circuit 50 of FIG. 14 becomes active, so the stored charge will remain at this peak until the positive adaptive rail circuit 50 becomes active. When the positive adaptive rail circuit 50 of FIG. 14 becomes active, the positive charge pump comparator 44P will be switched positive, turning on the P-channel MOSFET 41P of FIG. 15. This allows the stored charge in both positive charge pump capacitors C1P and C2P to provide current to increase the positive adaptive rail 21 of FIG. 14. This provides additional benefits by increasing the maximum stored charge available to the positive adaptive rail circuit 50 and decreasing the inrush current required to charge the single positive rail flying capacitor C1P on startup. The capacitor C2P and the diode D2P could be omitted, reducing the maximum available stored charge and providing a switched output voltage at 42 when the positive charge pump comparator 44P of FIG. 14 switches positive. The output signal 42 would connect to the cathode side of the schottky diode D1P in this configuration. The main advantage of this modification is reduced circuit complexity.

Figure 16:
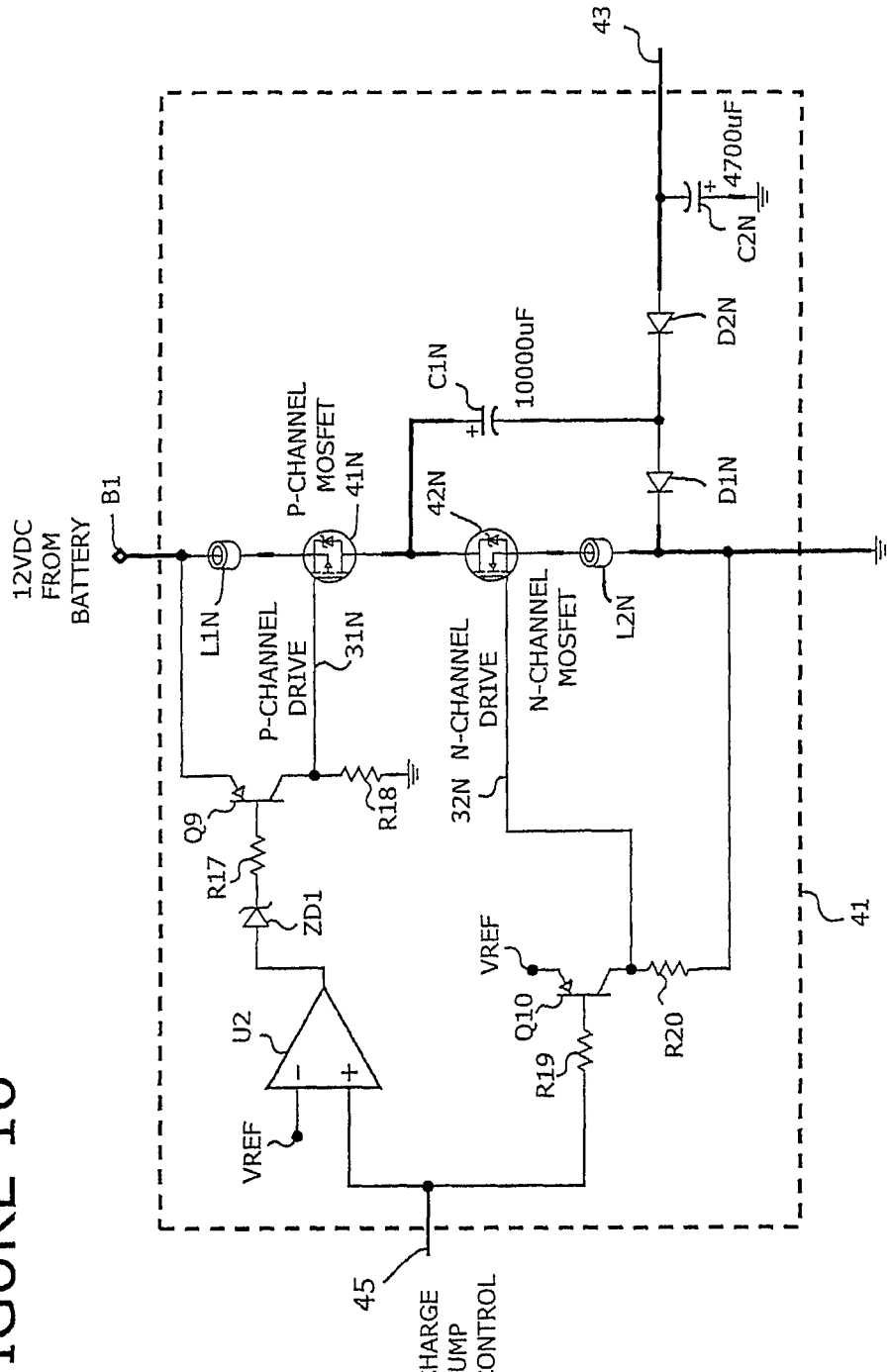
FIG. 16 is a schematic diagram of the negative charge pump circuit of FIG. 14.

Referring now to FIG. 16, the negative charge pump circuit 41 of the embodiment of FIG. 14 is shown. FIG. 16 is the same circuit as shown in FIG. 11 without the schottky diode D3N and with changes in value for the capacitors C1N and C2N to optimize performance for this embodiment. As a result, the detailed description of FIG. 16 is the same as the description given for FIG. 11. After a few switching cycles of the comparator 44N of FIG. 14, the second negative charge pump capacitor C2N will charge up to a voltage equal to minus two times the battery voltage minus the forward diode drop of the schottky diodes MN and D2N. There is no discharge path for the stored charge in the capacitor C2N until the negative adaptive rail circuit 51 of FIG. 14 becomes active, so the stored charge will remain at this negative peak until the negative adaptive rail circuit 51 becomes active. When the negative adaptive rail circuit 51 of FIG. 14 becomes active, the negative charge pump comparator 44N will be switched negative. Looking again at FIG. 16, this turns on the N-channel MOSFET 42N and allows the stored charge in both negative charge pump capacitors C1N and C2N to provide current to increase the negative adaptive rail 23 of FIG. 14. This provides additional benefits by increasing the maximum stored charge available to the negative adaptive rail circuit 51 and decreasing the inrush current required to charge the single capacitor C1N on startup. The capacitor C2N and diode D2N could be omitted, reducing the maximum available stored charge and providing a switched output voltage at 43 when the negative charge pump comparator 44N of FIG. 14 switches negative.

The output signal 43 would connect to the anode side of the schottky diode MN in this configuration. As mentioned above, the main advantage of this modification is reduced circuit complexity.

Figure 17:
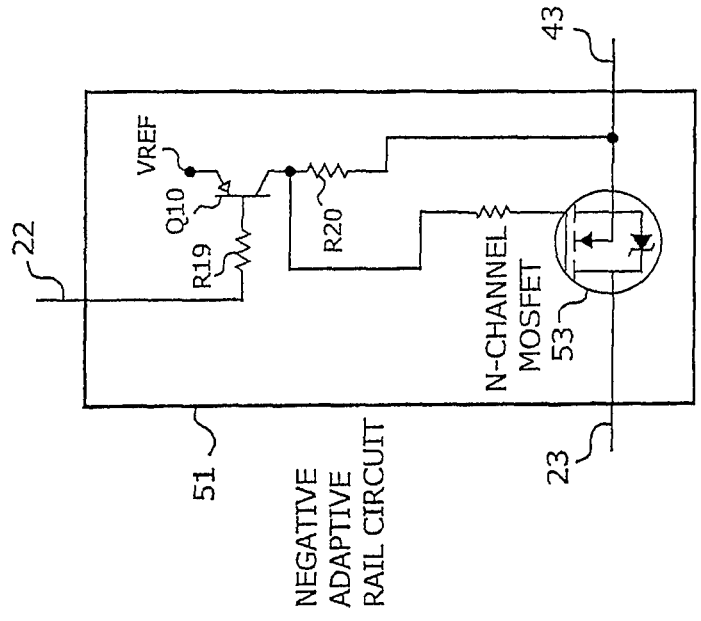
FIG. 17 is a schematic diagram of the positive adaptive rail circuit of FIG. 14.
Figure 18:
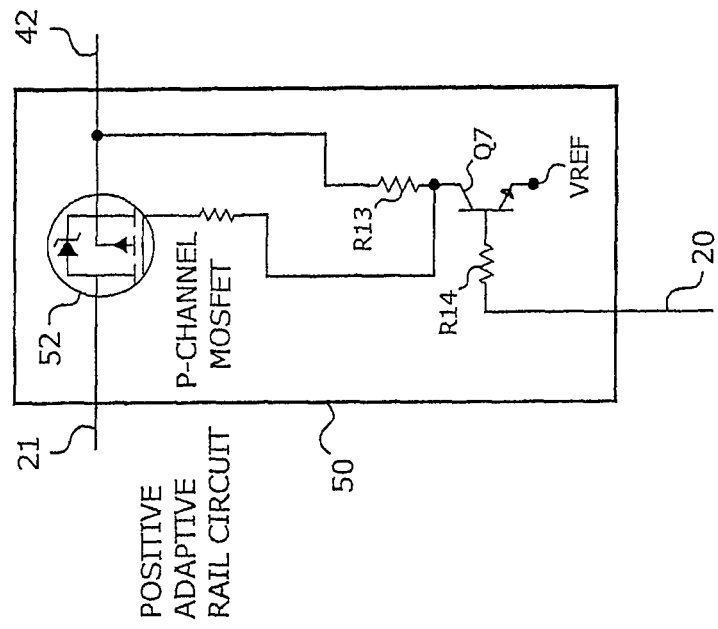
FIG. 18 is a schematic diagram of the negative adaptive rail circuit of FIG. 14.

FIGS. 17 and 18 show the positive and negative adaptive rail circuits 50 and 51 of FIG. 14, respectively. As seen in FIG. 17, the positive adaptive rail circuit 50 includes the P-channel power MOSFET transistor 52 which receives the input signal 42 and provides a variable output voltage 21. The P-channel power MOSFET 52 is controlled by a small signal transistor Q7. The transistor Q7 receives the control signal 20 through a resistor R14 to the base connection of the transistor Q7. The emitter of the transistor Q7 is tied to VREF ½ supply and the collector of the transistor Q7 is connected to the gate of the P-channel MOSFET 52 through a gate resistor and also to a resistor R13 which is tied to input signal 42. In operation, when a positive going control signal 20 appears, the transistor Q7 becomes conductive, providing gate drive to the P-channel MOSFET 52 which in turn increases the output voltage 21, providing an increase above the battery voltage seen at the power amplifier 14 of FIG. 14. By connecting the resistor R13 to the input signal 42, the power P-channel MOSFET 52 does not become active until the transistor Q7 starts to conduct. The differential amplifier 24 of FIG. 14 provides the control signal to the base of the transistor Q7. The output of the differential amplifier 24 is a voltage equal to the difference between the power amplifier 14 output voltage swing and the positive adaptive rail 21 plus the rail offset voltage 27P. This will keep the positive adaptive rail voltage 21 above the output signal swing by an amount equal to the rail offset 27P at all times up to the point where the output signal swings beyond the available voltage at 42 and the output clips of the power amplifier 14.

Turning to FIG. 18, the negative adaptive rail circuit 51 includes the N-channel power MOSFET transistor 53 which receives the input signal 43 and provides a variable output voltage 23. The N-channel power MOSFET 53 is controlled by a small signal transistor Q10. The transistor Q10 receives the control signal 22 through a resistor R19 to the base connection of the transistor Q10. The emitter of the transistor Q10 is tied to VREF ½ supply and the collector of the transistor Q10 is connected to the gate of the N-channel MOSFET 53 through a gate resistor and also to a resistor R20 which is tied to the input signal 43. In operation, when a negative going control signal 22 appears, the transistor Q10 becomes conductive, providing gate drive to the N-channel MOSFET 53 which in turn increases the negative output voltage 23, providing an increase below the battery ground G1 seen at the power amplifier 14 of FIG. 14. By connecting the resistor R20 to the input signal 43, the power N-channel MOSFET 53 does not become active until the transistor Q10 starts to conduct. The differential amplifier 25 of FIG. 14 provides the control signal to the base of the transistor Q10. The output of the differential amplifier 25 is a voltage equal to the difference between the output voltage swing of the power amplifier 14 and the negative adaptive rail 23 plus the rail offset voltage 27N. This will keep the negative adaptive rail voltage 23 below the output signal swing by an amount equal to the rail offset 27N at all times up to the point where the output signal swings negative beyond the available voltage at 43 and the output clips of the power amplifier 14.

In operation, all embodiments of the invention will produce a signal swing of nearly 40 volts peak into an 8 ohm load which will deliver 100 watts and nearly 180 watts into a 4 ohm load. As previously noted, higher impedance 8 ohm and 4 ohm speakers have higher sensitivity ratings and will therefore provide higher output sound pressure levels than the lower impedance speakers of 2 or 1 ohms. The invention, therefore, also allows higher sound pressure levels with reduced current consumption.

Simplified Embodiment of the Adaptive Rail Power Amplifier

Figure 19:
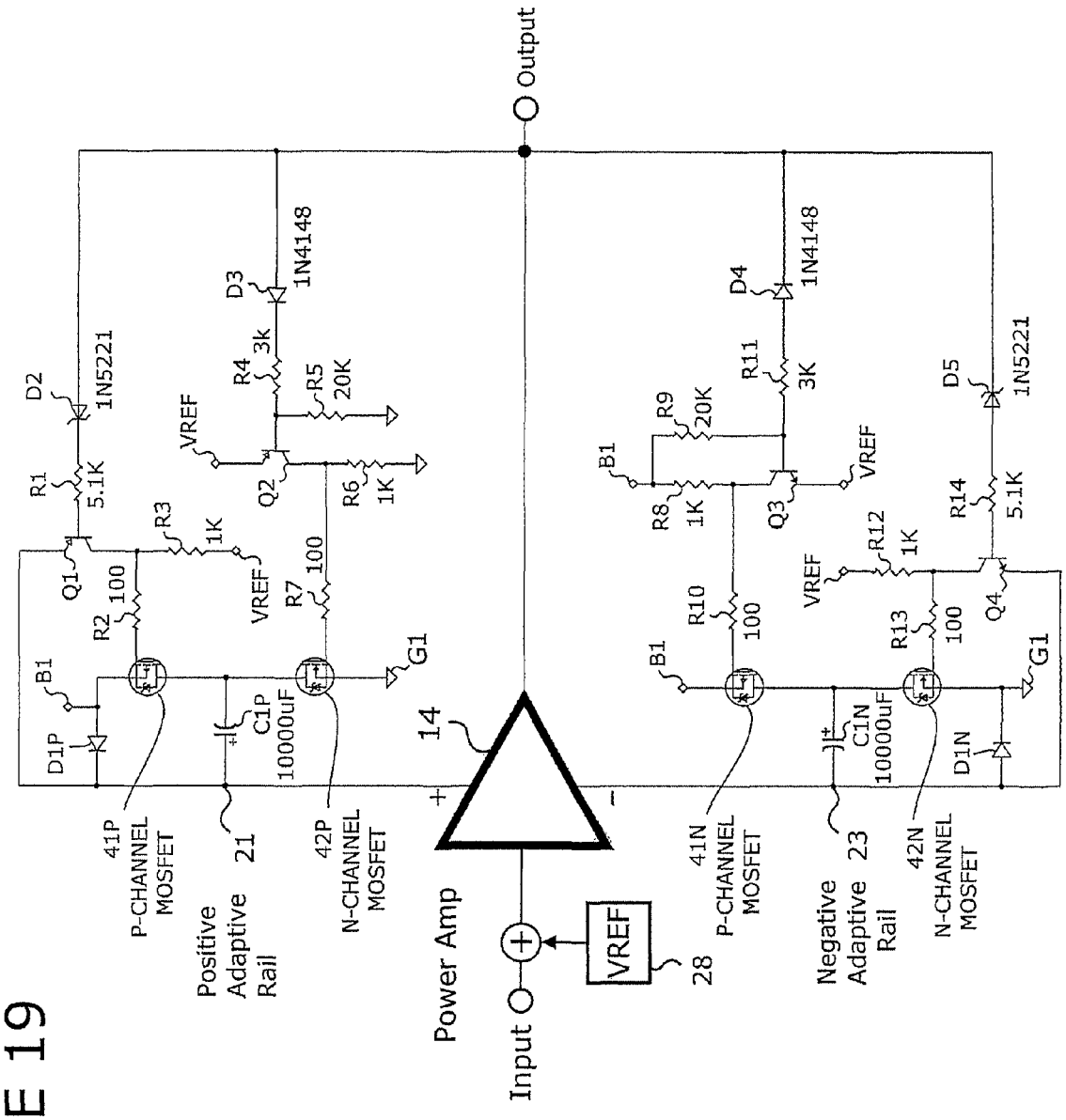
FIG. 19 is a schematic diagram of an alternate or simplified embodiment of the adaptive rail power amplifier.

Turning now to FIG. 19, typical Battery voltage of 12 volts (14.4 volts with the alternator running) is applied at B1 and Battery Ground is applied at G1. Power amplifier 14 receives a positive power supply voltage from Positive Adaptive Rail 21 and receives negative power supply voltage from Negative Adaptive Rail 23. With no input signal, or a low level input signal, the voltage on Positive Adaptive Rail 21 will equal the Battery voltage less one diode drop from schottky diode D1P and the Negative Adaptive Rail 23 will equal the Battery ground less one diode drop from schottky diode D1N. A reference voltage of ½ B1 (battery voltage) is applied as signal VREF as a bias reference at the input and also at nodes indicated as VREF. The VREF signal will track the battery and provide ½ battery reference voltage as the battery voltage fluctuates. The output of amplifier 14 will be centered at VREF half way between B1, the positive battery voltage, and G1, the ground side of the battery. The emitter of Q1 is connected to node 21, which is equal to B1 minus the forward diode drop of schottky diode D1P. The base of Q1 is connected to 5.1K resistor R1 and to the cathode side of zener diode D2. The anode side of D2 is connected to the output of amplifier 14. When the output swing of amplifier 14 is low, base current will flow in Q1, turning Q1 on, which will in turn pull gate resistor R2 positive ensuring that P-CHANNEL power MOSFET transistor will be turned off. This keeps P-CHANNEL power MOSFET transistor 41P turned off until the output voltage swing of amplifier 14 exceeds the point where Q2 switches off plus a predefined dead zone voltage. Q2 emitter is tied to VREF and base resistor R5 is tied to ground which will turn on Q2 with no input signal thereby turning on N-CHANNEL power MOSFET transistor 42P by pulling gate resistor R7 positive causing storage capacitor C1P to charge through schottky diode D1P. When the output swing of amplifier 14 increases positive above VREF by more than one volt Q2 will switch off pulling the gate of N-CHANNEL power MOSFET transistor 42P low due to collector connected pull down resistor R6. Q2's base drive is a result of the divider voltage of R5/R4+R5 times VOUT of power amplifier 14. The VBE of Q2 is effectively cancelled out by the forward drop of diode D3 making the switch point of Q2 as described above. With the values shown in FIG. 1 and a battery voltage of 12 volts Q2 will switch off when the output signal swing exceeds approximately 7 volts positive, one volt above VREF. As the output signal of amplifier 14 continues to swing positive approaching B1, Q1 will stop conducting. When power amplifier 14 output signal approaches B1, minus the diode drop of schottky diode D1P, minus the VBE of transistor Q1 and the zener voltage of zener diode D2 transistor Q1 will stop conducting. Zener diode D2 will typically be a 1N5221 which has a 2.4 volt zener voltage. This will provide a dead zone of approximately 1.6 volts between the point where transistor Q2 switches off and the point where transistor Q1 will start to turn off allowing P-CHANNEL power MOSFET transistor 41P to become active. The Source connection of P-CHANNEL power MOSFET transistor 41P is connected directly to the B1 positive battery connection. As power MOSFET transistor 41P becomes active it will pull the negative plate of storage capacitor C1P positive towards the B1 battery potential thereby increasing the Positive Adaptive Rail 21 supply voltage. As the Positive Adaptive Rail 21 increases, Q1's emitter voltage increases positive, which keeps Q1 in a linear or non-saturated condition providing a positive adaptive power supply rail that will track the output signal by 3.4 volts positive above the output signal swing. If the output voltage swing exceeds the battery voltage plus the available stored charge in capacitor C1P, the positive output swing will start to clip. The Positive Adaptive Rail voltage will start to increase above the battery voltage when the output voltage swing increases positive by more than B1 minus the forward drop of schottky diode D1P, minus the VBE of Q1 minus the zener voltage of zener diode D2. With a 2.4 volt zener diode this offset will be approximately 3.4 volts. The offset voltage can be increased by changing zener diode D2, thus it will be apparent to the skilled artisan that increasing the zener voltage will increase the offset voltage by an equal amount.

The operation of the Negative Adaptive Rail will now be described. The emitter of Q4 is connected to node 23, which is equal to G1 minus the forward diode drop of schottky diode D1N. The base of Q4 is connected to 5.1K resistor R14 and to the anode side of zener diode D5. The cathode side of D5 is connected to the output of amplifier 14. When the output voltage swing of amplifier 14 is low, base current will flow in Q4, turning Q4 on, which will in turn pull gate resistor R9 negative ensuring that P-CHANNEL power MOSFET transistor 42N will be turned off. This keeps P-CHANNEL power MOSFET transistor 42N turned off until the output voltage swing of amplifier 14 swings negative and exceeds the point where Q3 switches off plus a predefined dead zone voltage. Q3 emitter is tied to VREF and base resistor R9 is tied to B1 which will turn on Q3 with no input signal thereby turning on N-CHANNEL power MOSFET transistor 41N by pulling gate resistor R10 positive causing storage capacitor C1N to charge through schottky diode D1N. When the output swing of amplifier 14 increases negative below VREF by more than one volt Q3 will switch off pulling the gate of N-CHANNEL power MOSFET transistor 41N high due to collector connected pull up resistor R8. Q3's base drive is a result of the divider voltage of R9/R11+R9 times VOUT of power amplifier 14. The VBE of Q3 is effectively cancelled out by the forward drop of diode D4 making the switch point of Q3 as described above. With the values shown in FIG. 1 and a battery voltage of 12 volts Q3 will switch off when the output signal swing exceeds approximately 7 volts negative, one volt below VREF. As the output signal of amplifier 14 continues to swing negative approaching G1, Q4 will stop conducting. When power amplifier 14 output signal approaches G1, minus the diode drop of schottky diode D1N, plus the VBE of transistor Q4 and the zener voltage of zener diode D5 transistor Q3 will stop conducting. Zener diode D5 will typically be a 1N5221 which has a 2.4 volt zener voltage. This will provide a dead zone of approximately 1.6 volts between the point where transistor Q3 switches off and the point where transistor Q4 will starts to turn off allowing N-CHANNEL power MOSFET transistor 42N to become active. The Source connection of N-CHANNEL power MOSFET transistor 42N is connected directly to the G1 negative battery connection. As power MOSFET transistor 42N becomes active it will pull the positive plate of storage capacitor C1N negative towards the G1 battery ground potential thereby increasing the Negative Adaptive Rail 23 supply voltage. As the Positive Adaptive Rail 23 increases negative Q4's emitter voltage increases negative, which keeps Q4 in a linear or non-saturated condition providing a negative adaptive power supply rail that will track the output signal by 3.4 volts negative below the output signal swing. If the output voltage swing exceeds the battery ground potential plus the available stored charge in capacitor C1N, the negative output swing will start to clip. The Negative Adaptive Rail voltage will start to increase below the battery ground potential when the output voltage swing increases negative by more than G1 minus the forward drop of schottky diode D1N, minus the VBE of Q4 and the zener voltage of zener diode D5. With a 2.4 volt zener diode this offset will be approximately 3.4 volts. The offset voltage can be increased by changing zener diode D5, thus it will be apparent to the skilled artisan that increasing the zener voltage will increase the negative offset voltage by an equal amount.

The circuit of FIG. 19 will provide a positive and negative adaptive rail that will track the output signal by a predefined offset voltage and will charge the storage capacitors C1P and C1N when the power amplifier 14 output signal is low in amplitude or on power up when the amplifier output is zero. The circuit of FIG. 19 will also provide accurate positive and negative adaptive tracking rails regardless of the amount of drop in voltage in the storage capacitors C1P and C1N. In operation the output signal swing of amplifier 14 and positive adaptive rail signal 21 will be virtually identical to that shown graphically in FIG. 12 of the co-pending application.

It will be apparent to the skilled artisan that the circuit of FIG. 19 can be implemented as a bridge mode design with one amplifier driving one side of the speaker in phase and a second channel of amplification driving the other side of the speaker out of phase, thereby providing twice the voltage swing and four times the output power. It will also be apparent to the skilled artisan that the circuit shown in FIG. 19 will have advantages and can be implemented in a bipolar power supply design with a positive voltage, a ground reference and a negative voltage eliminating the need for a VREF reference bias voltage.

What is claimed is:

1. A method for processing an audio signal comprising the steps of:
   feeding the audio signal to a power amplifier to produce an output signal;
   applying positive and negative power supply voltages centered with respect to the audio signal to positive and negative power supply rails of the power amplifier, respectively;
   comparing the output signal with the positive and negative power supply rail voltages to produce dynamically varying positive and negative control signals, respectively;
   feeding the positive and negative control signals to positive and negative high current charge pumps, respectively; and
   adding supplemental positive and negative voltages from the positive and negative charge pumps to the positive and negative power supply rails, respectively, to produce a linear adaptive rail voltage which tracks the output signal.

* * * * *